(12) United States Patent
Suzuki et al.

(10) Patent No.: US 8,014,652 B2
(45) Date of Patent: Sep. 6, 2011

(54) FILAMENT LAMP AND LIGHT-IRRADIATION-TYPE HEAT TREATMENT DEVICE

(75) Inventors: Shinji Suzuki, Tokyo-to (JP); Akinobu Nakashima, Himeji (JP); Kenji Tanino, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 769 days.

(21) Appl. No.: 12/129,063

(22) Filed: May 29, 2008

(65) Prior Publication Data

US 2008/0298787 A1 Dec. 4, 2008

(30) Foreign Application Priority Data

May 29, 2007 (JP) .................................. 2007-142275

(51) Int. Cl.
*F26B 3/30* (2006.01)
(52) U.S. Cl. ........... 392/411; 392/407; 315/46; 219/483
(58) Field of Classification Search .................. 392/411; 219/216, 486, 483; 315/46
See application file for complete search history.

(56) References Cited

U.S. PATENT DOCUMENTS

| | | | | |
|---|---|---|---|---|
| 3,579,021 A | * | 5/1971 | Kimball | ......................... 313/274 |
| 3,617,797 A | * | 11/1971 | Meijer et al. | .............. 313/318.12 |
| 3,634,722 A | * | 1/1972 | Palmer et al. | .................. 313/279 |
| 3,678,319 A | * | 7/1972 | Notelteirs et al. | ............ 313/271 |
| 3,736,455 A | * | 5/1973 | Notelteirs et al. | ............ 313/274 |
| 4,080,548 A | * | 3/1978 | Johnson | ........................... 315/68 |
| 4,442,374 A | * | 4/1984 | Morris et al. | .................. 313/316 |
| 4,710,676 A | * | 12/1987 | Morris et al. | .................. 313/579 |
| 5,962,973 A | * | 10/1999 | Rice | .............................. 313/580 |
| 6,876,816 B2 | | 4/2005 | Shigeoka et al. | |
| 7,471,885 B2 | * | 12/2008 | Mizukawa et al. | ........... 392/407 |
| 7,639,930 B2 | * | 12/2009 | Mizukawa et al. | ........... 392/416 |
| 2006/0197454 A1 | | 9/2006 | Mizukawa et al. | |

FOREIGN PATENT DOCUMENTS

| | | |
|---|---|---|
| DE | 100 24 709 A1 | 11/2001 |
| JP | 4-329253 A | 11/1992 |
| JP | 7-37833 A | 2/1995 |
| JP | 7-16353 U | 3/1995 |

* cited by examiner

*Primary Examiner* — Thor Campbell
(74) *Attorney, Agent, or Firm* — Roberts Mlotkowski Safran & Cole, P.C.; David S. Safran

(57) ABSTRACT

A filament lamp includes multiple filament assemblies having filaments connected to paired leads, arrayed in order within a light emitting tube and following a tube axis thereof. Each lead is electrically connected in a seal area. Each filament is powered independently. The light emitting tube includes insulating walls or inner tubes between the filaments and leads that have openings through which the leads pass, and located along the tube axis in proximity to the inner wall of the light emitting tube. Multiple lead accommodation spaces corresponding to the number of leads are provided in the light emitting tube by the insulating walls with each lead passing through an opening in the insulating wall and placed without short circuits in its lead accommodation space.

12 Claims, 17 Drawing Sheets

Fig. 4
a) 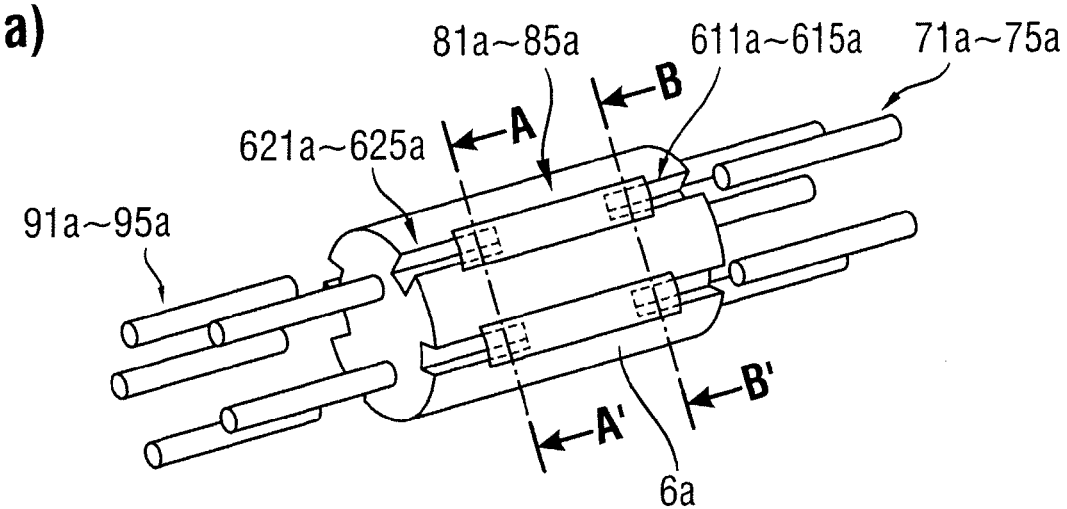
b) A-A' 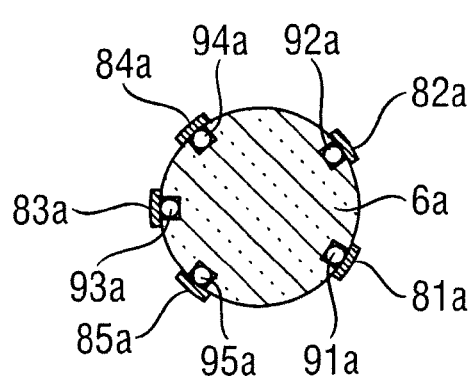
c) B-B' 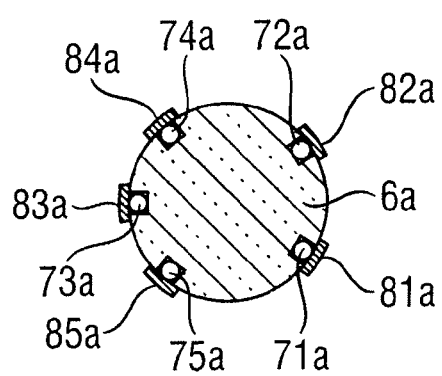

Fig. 11
a)
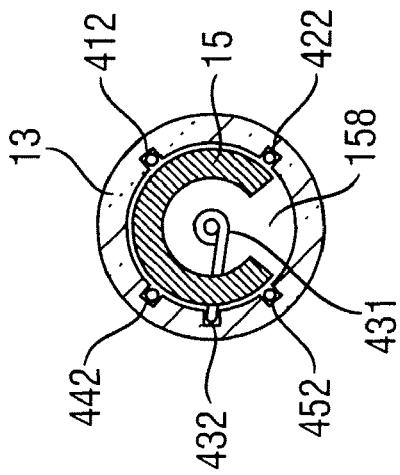
A-A'
b)
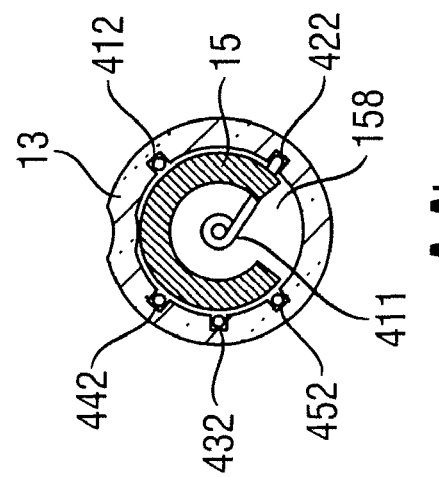
B-B'
c)
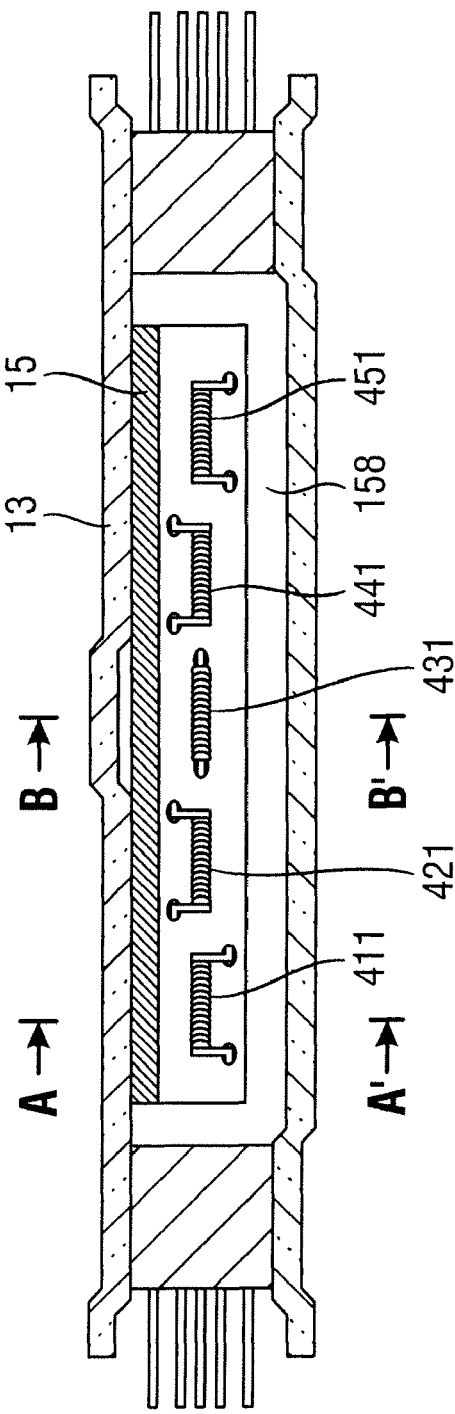

Fig. 12
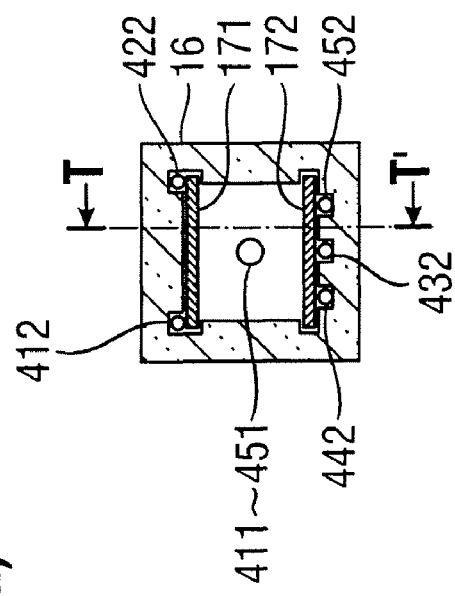
a)
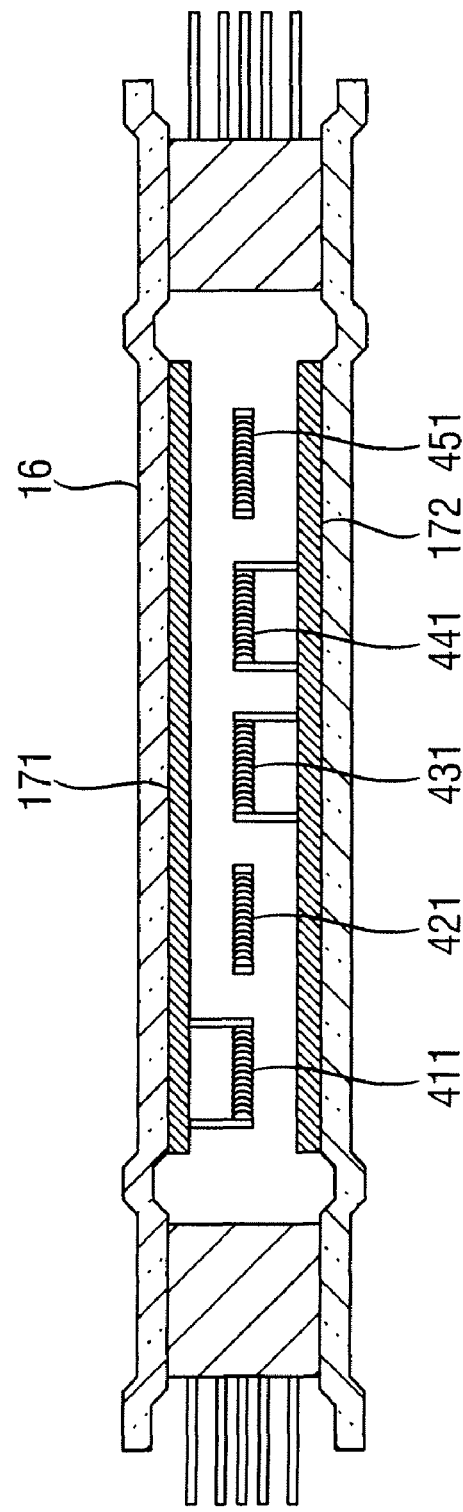
b)

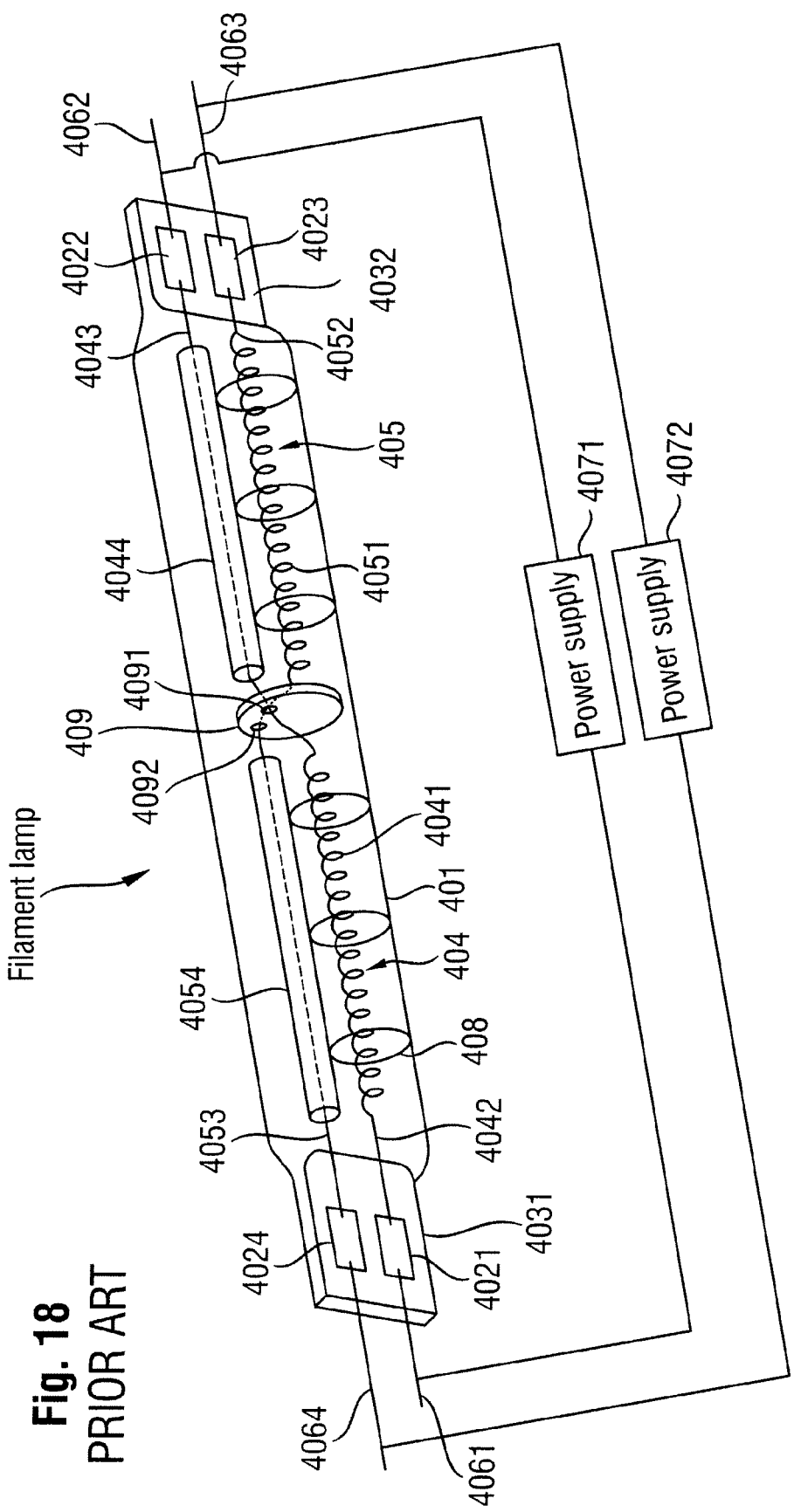

# FILAMENT LAMP AND LIGHT-IRRADIATION-TYPE HEAT TREATMENT DEVICE

FIELD OF INVENTION

This invention concerns a filament lamp and light-irradiation-type heat treatment device, and particularly a filament lamp used for heat treatment of a workpiece and a light-irradiation-type heat treatment device equipped with such a filament lamp.

DESCRIPTION OF RELATED ART

Heat treatment is used in a variety of processes in the manufacture of semiconductors, including film growth, oxidation, nitriding, film stabilization, silicidation, crystallization, and ion injection activation. In particular, rapid thermal processing (hereafter referred to as "RTP") of a semiconductor wafer or other workpiece to be treated by quickly raising and lowering its temperature enables improved throughput and quality, and so its use is desirable.

Incandescent lamps, for example, are used as the light source in this sort of light-irradiation-type heat treatment device (hereafter referred to as "heat treatment device").

Incandescent lamps have filaments arranged inside light emitting tubes made of a material that is transparent to light. Incandescent lamps irradiate 90% or more of the invested power, and can heat the workpiece to be treated without making contact. It is therefore possible, when using them as heat sources for heating glass substrates or semiconductor wafers, to raise the temperature of the workpiece to be treated more quickly than by the resistance heating method, specifically, to a temperature of 1000° C. or higher in a period from several seconds to several tens of seconds, and also to cool the workpiece quickly by stopping the light irradiation.

When the workpiece to be treated is, for example, a semiconductor wafer (e.g., a silicon wafer), if there is unevenness of the temperature distribution of the semiconductor wafer when it is heated to a temperature of 1050° C. or higher a phenomenon called "slip", in which crystal transition defects arise and quality declines, is liable to occur in the semiconductor wafer. For this reason, it becomes necessary to heat the semiconductor wafer, hold it at a high temperature, and then cool it so that the temperature distribution will be even across the entire surface. In other words, highly precise uniformity of temperature of the workpiece to be treated is sought in RTP.

Even in the event that the light irradiation is done so that the degree of irradiation is uniform for semiconductor wafers that have the same physical characteristics across the entire surface of the semiconductor wafer, the temperature of the semiconductor wafer will not be uniform. For example, the temperature at the edges of the semiconductor wafer will be lower at the edges because heat will be radiated by the side surfaces of the semiconductor wafer. As a result of this heat release, there will be a temperature distribution on the semiconductor wafer. If there is unevenness in the semiconductor wafer temperature distribution, when the semiconductor wafer is heated to 1050° C. or higher, as noted above, slip will occur in the semiconductor wafer.

Accordingly, it is desirable to compensate for the temperature drop due to heat radiation from the sides of the semiconductor wafer and thus even out the temperature distribution in the semiconductor wafer by means of light irradiation such that the surface at the edges of the semiconductor wafer is irradiated to a greater degree than the surface at the center of the semiconductor wafer.

As for conventional heat treatment device, Japanese Pre-grant Patent Report H7-37833 discloses heat treatment device that uses incandescent lamps to heat a glass substrate or semiconductor wafer.

FIG. 15 is a cross section of heat treatment device 200 with the conventional technology described in Japanese Pre-grant Patent Report H7-37833. As shown in this Figure, this heat treatment device 200 is constituted such that a workpiece 202 to be treated is accommodated in a chamber 201 made of light-transparent material, with two stages of multiple incandescent lamps for heating 203, 204 outside the chamber 201, facing from above and below, and with axes that cross each other. Both surfaces of the workpiece 202 to be treated are heated by means of light irradiation from the incandescent lamps for heating 203, 204.

FIG. 16 is an oblique simplified view of the heat treatment device shown in FIG. 15, including the upper and lower stages of incandescent lamps for heating 203, 204 and the workpiece 202 to be treated. As shown in FIGS. 15-16, the upper and lower incandescent lamps for heating 203, 204 are placed with their tube axes crossing and so it is possible to heat the workpiece 202 to be treated uniformly. Using this equipment, moreover, it is possible to prevent the reduction of temperature due to the action of heat radiation from the edges of the workpiece 202 to be treated. For example, the lamp output of the incandescent lamps for heating L1, L2 at the ends of the stage above the workpiece 202 to be treated is set higher than the lamp output of the incandescent lamp for heating L3 at the center. Similarly, the lamp output of the incandescent lamps for heating L4, L5 at the ends of the stage below the workpiece 202 to be treated is set higher than the lamp output of the incandescent lamp for heating L6 at the center. It is possible, by this means, to compensate for the reduction of temperature due to the action of heat radiation from the workpiece 202 to be treated, to minimize the temperature difference between the center and edges of the workpiece 202 to be treated, and thus to make the temperature distribution of the workpiece 202 to be treated uniform.

It has been learned, however, that the problem described below may occur in the conventional heat treatment device described above. Specifically, in the case that the workpiece 202 to be treated is a semiconductor wafer, for example, it is common to form a film of metallic oxide or other material on the surface of a semiconductor wafer by a sputtering method and then dope it with impurities by means of ion implantation. In this case, the film thickness of such a metallic oxide and the density of the impurity ions will have a localized distribution on the surface of the semiconductor wafer. This localized distribution will not necessarily have central symmetry with respect to the center of the semiconductor wafer. Taking the density of the impurity ions as an example, sometimes there is a difference, as shown in FIG. 16, between the density of the impurity ions in a small, special region 2021 that does not have central symmetry with respect to the center of the semiconductor wafer and the other region 2022. Even if such a special region 2021 and the other region 2022 are irradiated to have the same irradiation intensity, there may be a difference in the speed of temperature rise between the special region 2021 and the other region 2022, and the temperature of the special region 2021 and the temperature of the other region 2022 will not necessarily be the same.

Using the conventional heat treatment device 200 described above, it is relatively easy to compensate for the temperature drop at the edges of the workpiece 202 to be treated due to heat radiation and prevent reduction of the temperature at the edges, and to make the temperature distribution of the workpiece 202 to be treated uniform. Nevertheless, for a small, special region 2021 on the semiconductor wafer with a total length that is shorter than the light emission length of the lamp, as shown in FIG. 16, in the event of light irradiation suited to the properties of the special region 2021, there will also be light irradiation of the region 2022 outside the special region 2021. Accordingly, it is not possible to control the temperature state so that it is suited both to the special region 2021 and to the other region 2022. That is, it is not possible to control the irradiation of the small, special region 2021 so that the temperature of the two regions 2021 and 2022 is uniform. Therefore, there is the problem of an undesirable temperature distribution in the treatment temperature of the workpiece 202 to be treated, and it becomes difficult to apply the desired physical properties to the workpiece 202 to be treated.

FIG. 17 is a cross section of the heat treatment device 300 of the related art described in JP-A-2002-203804 (US-A-2004/0112885). As shown in this Figure, this heat treatment device 300 has, within a lamp housing 301, a first lamp unit 302 that has an array of multiple U-shaped, double-ended lamps 3022 with equipment at both ends of the light emitting tubes to supply power to the filaments 3021, arrayed parallel to and perpendicular to the plane of the paper, and a second lamp unit 303 located below the first lamp unit 302, having an array of multiple straight-line, double-ended lamps 3032 with equipment at both ends of the light emitting tubes to supply power to the filaments 3031, running along and perpendicular to the plane of the paper. Such an arrangement provides heat treatment of a workpiece to be treated 304 that is placed below the second lamp unit 303.

The portions of the workpiece to be treated 304 that are in contact with the supporting ring 305, which supports the workpiece to be treated 304, tend to have a lower temperature than other portions. JP-A-2002-203804 (US-A-2004/0112885) describes a mechanism to control those U-shaped lamps belonging to the first lamp unit 302 that are positioned above the portions in contact to have a higher power, in order to raise the temperature of the portions in contact. Further, JP-A-2002-203804 (US-A-2004/0112885) describes the use of this heat treatment device 300 as outlined below. First, the semiconductor wafer that is the workpiece to be treated 304 is divided into multiple concentric zones with central symmetry. Then, by combining the irradiation patterns of the individual lamps of the first and second lamp units 302, 303, a combined irradiation distribution pattern that corresponds to those zones and that has central symmetry relative to the center of the semiconductor wafer is formed, and heating is done in response to the temperature changes of each zone. At that time, the semiconductor wafer that is the workpiece to be treated 304 is rotated to suppress the effect of variations in the intensity of light from the lamps. That is, zones located concentrically can be heated at individual illumination intensities.

Accordingly, the heat treatment device 300 described in JP-A-2002-203804 (US-A-2004/0112885) is capable of controlling temperature in narrow special regions on the workpiece to be treated 304 as long as those regions have central symmetry with respect to the center of the semiconductor wafer. Nevertheless, in the event that the special regions do not have central symmetry with respect to the center of the semiconductor wafer, it is not possible to solve the problem described above properly because heat treatment is done by rotating the semiconductor wafer.

Moreover, it is thought that the following problems could occur if this heat treatment device 300 were actually used. Specifically, a U-shaped lamp comprises a horizontal portion 3023 and a pair of vertical portions 3024, but because only the horizontal portion 3023 where the filament 3021 is located contributes to light emission, the individual lamps are separated by spaces to a degree that cannot be ignored, and so it is conceivable that undesirable temperature distributions will occur in areas beneath the spaces.

That is, even though the illumination-intensity distributions of the lamps of the first and second lamp units 302, 303 of the heat treatment device 300 are combined to form a synthesized distribution of the illuminance with central symmetry on the semiconductor wafer, the illuminance beneath the spaces mentioned above will change (e.g., drop) rapidly, and so even though heating is done in response to the temperature changes in each zone, it will conceivably be relatively difficult to reduce the temperature distribution that occurs in the vicinities beneath the spaces. Furthermore, with regard to this sort of heat treatment device 300, there has been a trend in recent years to reduce as much as possible space (e.g., primarily with respect to height) for laying out the lamp units. Accordingly, if U-shaped lamps are used, space will be needed for the vertical portions 3024 of the lamps, which is not desirable from the perspective of space reduction.

FIG. 18 is a perspective view of a conventional filament lamp 400, described in JP-A-2006-279008 (US-A-2006/0197454), and which the present inventors proposed in a prior application to resolve the problems described above. This filament lamp 400 is constituted as outlined below. Both ends of the light emitting tube 401 of the filament lamp 400 are formed with hermetic seal areas 4031, 4032 in which are embedded metal foils 4021 to 4024. Within the light emitting tube 401 are multiple (e.g., two, as shown in FIG. 18) filament assemblies 404, 405, comprising filaments 4041, 4051 and leads 4042 to 4043, 4052 to 4053 that supply power to the filaments 4041, 4051. Here, when the filament assemblies 404, 405 are placed in the light emitting tube 401, they are arranged in order so that the filaments 4041, 4051 extend along the length of the light emitting tube 401.

In one filament assembly 404, the lead 4042 that is connected to one end of the filament 4041 is electrically connected to the metal foil 4021 that is embedded in the seal area 4031 at one end of the light emitting tube 401. Further, the lead 4043 that is connected to the other end of the filament 4041 in the filament assembly 404 is threaded through the through hole 4091 of insulator 409, is covered by an insulating tube 4044 in the area that faces the filament 4051 of the other filament 405, and is electrically connected to the metal foil 4023 that is embedded in the seal area 4032 at the other end of the light emitting tube 401. Similarly, in the other filament assembly 405, the lead 4052 that is connected to one end of the filament 4051 is electrically connected to the metal foil 4023 that is embedded in the seal area 4032 at one end of the light emitting tube 401. Further, the lead 4053 that is connected to the other end of the filament 4051 in the filament assembly 405 is threaded through the through hole 4092 of insulator 409, is covered by an insulating tube 4054 in the area that faces the filament 4041 of the one filament 404, and is electrically connected to the metal foil 4024 that is embedded in the seal area 4031 at the other end of the light emitting tube 401.

The ends of the metal foils 4021 to 4024 embedded in the seal portions 4031, 4032 that are opposite the ends connected to the leads 4042 to 4043, 4052 to 4053 of the filament assemblies 404, 405 are connected to external leads 4061 to 4064 that project from the seal areas 4031, 4032. Accordingly, each filament assembly 404, 405 is connected to two external leads 4061 to 4062, and 4063 to 4064 by way of the metal foils 4021 to 4022, and 4023 to 4024. Power supplies 4071, 4072 are connected to the filaments 4041, 4051 by way of the external leads 4061 to 4062, and 4063 to 4064. It is possible, by this means, to supply power individually to the filaments 4041, 4051 of the filament assemblies 404, 405 of the filament lamp 400.

Each filament 4041, 4051 is supported, so that it does not contact the light emitting tube 401, by circular anchors 408 that are sandwiched between the inner wall of the light emitting tube 401 and the insulating tubes 4044, 4054. Here, if there were contact between the filaments 4041, 4051 and the inner wall of the light emitting tube 401 while the filament was emitting light, the light transmissivity of the light emitting tube 401 where the contact occurs would be impaired because of a loss of transparency of the light emitting tube 401 due to heat from the filaments 4041, 4051. The purpose of the anchors 408 is to prevent this problem. Multiple anchors 408 are placed along the length of the light emitting tube 401 for each filament 4041, 4051. Further, the anchors 408 are flexible so that the multiple filament assemblies 404, 405 can be easily inserted into the light emitting tube 401 when the filament lamp 400 is produced. Further, a slight gap is left between the anchors 408 and the space between the inner wall of the light emitting tube 401 and the insulating tubes 4044, 4054.

This filament lamp 400 has multiple filaments 4041, 4051 within the light emitting tube 401 and is constituted to provide individual control of the light emitted by each filament 4041, 4051. If such filament lamps 400 are arrayed in parallel rows and used as a light source in light-irradiation-type heat treatment device, it is possible to arrange filaments with higher precision with respect to the regions to be irradiated on the workpiece to be treated as compared to using conventional filament lamps having a single filament in the light emitting tube.

Accordingly, by means of light-irradiation-type heat treatment device using such filament lamps, it is possible to supply power individually to the multiple filaments, and so it is possible to irradiate with the desired irradiation distribution according to the characteristics of the workpiece to be treated even when the distribution of localized temperature variations on the workpiece to receive heat treatment is non-symmetrical with respect to the workpiece to be treated. Therefore, the workpiece to be treated can be heated evenly, even when the distribution of localized temperature variations on the workpiece to receive heat treatment is non-symmetrical with respect to the workpiece to be treated, and an even temperature distribution can be achieved across the entire irradiated surface of the workpiece to be treated.

Furthermore, when compared with the heat treatment device 70 that has U-shaped lamps described in JP-A-2002-203804 (US-A-2004/0112885), the above-described filament lamps can have a straight-line shape and so do not require the space corresponding to the vertical portion of U-shaped lamps, and so it is possible to reduce the size of the heat treatment device.

The present inventors fabricated light-irradiation-type heat-treatment device in which were mounted the filament lamps shown in FIG. 18, and found that the following problems occurred when the filament lamps were actually lit. In these filament lamps, the leads connected to the multiple filaments placed within the light emitting tubes were covered by insulating tubes. When the filament lamps were lit, however, it was learned that the problems explained below occurred because the insulating tubes absorbed light emitted by the filaments and reached high temperatures.

That is, in light-irradiation-type heat-treatment equipment in which are mounted filament lamps with insulation tubes, the workpiece to be treated is irradiated by light emitted by the insulation tubes that have reached a high temperature, in addition to light emitted by the filaments. In these filament lamps, however, the insulating tubes are located within the light emitting tube, separated from the inner surface of the light emitting tube; and because there is no way to avoid a temperature rise by the insulating tubes, it is not possible to suppress the light emitted by the insulation tubes that have reached a high temperature. Moreover, the irradiation intensity of the light emitted by these insulating tubes varies, depending on the temperature of the insulating tubes, and is also affected by various factors such as the distance between the insulating tube and filaments in proximity to the insulating tube, the thickness of the insulating tube, and the amount of power used for powering the filaments. It is very difficult, therefore, to control uniformly the intensity of light emitted by the insulating tubes.

In light-irradiation-type heat-treatment equipment in which were mounted the filament lamps shown in FIG. 18, therefore, the workpieces to be treated were irradiated by light of different irradiation intensities from the insulating tubes of the filament lamps, and so variations of the speed of temperature rise on the workpieces to be treated would occur even when heat treatment of the workpieces to be treated was conducted under the same operating conditions with light-irradiation-type heat-treatment equipment fabricated with the same specifications. It was not possible, therefore, to obtain the desired treatment characteristics.

"The same specifications" here means that each piece of light-irradiation-type heat treatment device had the same numbers of filament assemblies located in the filament lamps and the same numbers of filament lamps located in the lamp units. Moreover, the same placement of filament lamps in each lamp unit was used in the light-irradiation-type heat treatment device having the same specifications. "The same operating conditions" here means that the power used for powering the filament lamps located in the lamp units was the same, as well as the atmosphere in which the workpiece to be treated were located. For example, the type of gas and gas pressure were the same in each piece of light-irradiation-type heat treatment device.

These problems were prominent in filament lamps in which high power (e.g., 80 W/cm or more of power per unit length of filament) was used to power the filaments located in the light emitting tubes in order to quickly heat the workpiece to be treated, and filament lamps in which the inside diameter of the light emitting tube was no more that 2.5 times the outside diameter of the filament (e.g., when four or more filaments were placed in a light emitting tube with an inside diameter of 12 mm or less in order to place multiple filament lamps in a limited space with the purpose of controlling with high precision the temperature of the workpiece to be treated).

The problems above can be avoided, simply put, if the insulating tubes are removed from the light emitting tube. Nevertheless, if the insulating tubes are removed, putting the leads in the light emitting tube in a such an arrangement, the presence of numerous filament assemblies within the light emitting tube is liable to cause undesired discharge between filaments and the leads placed in the vicinity of the filaments, and between nearby leads among the multiple leads that surround a filament, which may result in the filament lamp becoming unusable because the leads can melt through. Another conceivable method is that of keeping the insulating tube from reaching a high temperature by using a light emitting tube with a larger inside diameter and increasing the separation between filaments and adjacent insulating tubes. However, when filament lamps are arranged with parallel tube axes, increasing the inside diameter of the light emitting tube would increase the separation between adjacent filaments in the direction perpendicular to the tube axes, which is liable to lead to deterioration of the distribution of illuminance on the workpiece to be treated. That method would also increase the size of the light-irradiation-type heat-treatment equipment if the desired number of filament lamps were included, and so in practical terms it cannot be adopted.

SUMMARY OF THE INVENTION

In view of the problem described above, the purpose of the present invention is to provide a filament lamp that assures insulation between a filament and the leads that surround that filament, and between leads in the vicinity of the filaments, so that unwanted discharge will not occur, and one in which there is no likelihood that unwanted light will be emitted. Another purpose of the present invention is to provide light-irradiation-type heat treatment device in which variations are not liable to occur during heat treatment of the workpiece to be treated.

The present invention adopts the following aspects to resolve the problem described above.

The first aspect includes a filament lamp having multiple filament assemblies, each comprising a coiled filament connected at both ends to leads that supply electrical power to the filament, the filaments being in a linear arrangement within a light emitting tube, which is formed with a hermetic seal area on at least one end, and extending along the tube axis of the light emitting tube, with power being supplied to each filament independently by means of electrical connection of the leads of the filament assemblies to multiple conductive pieces located in the seal area, in which there are within the light emitting tube an insulating wall between filaments and leads that has openings through which the leads pass, located along the tube axis in proximity to the inner wall of the light emitting tube, and multiple lead accommodation spaces, corresponding to the number of leads, formed to extend along the tube axis of the light emitting tube and divided by the light emitting tube and the insulating walls, with each lead connected to a filament passing through an opening in the insulating wall and placed without short circuits in its lead accommodation space.

The second aspect includes a filament lamp as described in the first aspect, in which the insulating wall comprises an inner tube fitted on the same axis as the light emitting tube.

The third aspect includes a filament lamp as described in the second aspect, in which multiple slots are formed on the outer surface of the inner tube, corresponding to the number of leads connected to their respective filaments, extending along the tube axis of the light emitting tube and separated from each other in the circumferential direction, and the lead accommodation spaces are formed by the slots and the inner surface of the light emitting tube.

The fourth aspect includes a filament lamp as described in the second aspect, in which multiple slots are formed on the inner surface of the light emitting tube, corresponding to the number of leads connected to their respective filaments, extending along the tube axis of the light emitting tube and separated from each other in the circumferential direction, and the lead accommodation spaces are formed by the slots and the outer surface of the inner tube.

The fifth aspect includes a filament lamp as described in any one of the second through the fourth aspects, in which openings are formed in the inner tube such that light emitted by the filaments is emitted without being obstructed.

The sixth aspect includes a filament lamp as described in the first aspect, in which multiple slots are formed on the inner surface of the light emitting tube, corresponding to the number of leads connected to their respective filaments, extending along the tube axis of the light emitting tube and separated from each other in the circumferential direction, the insulating wall comprises pairs of facing plates with the filaments sandwiched between them, and the lead accommodation spaces are formed by the slots and the plates.

The seventh aspect includes a filament lamp as described in any one of the first through the sixth aspects, in which the insulating wall is fused.

The eighth aspect includes a filament lamp as described in any one of the first through the seventh aspects, in which the light emitting tube and the insulating wall are fused along the tube axis of the light emitting tube.

The ninth aspect includes a filament lamp as described in any one of the first through the eighth aspects, in which the lead accommodation spaces are formed so that all leads of filaments other than a given filament are positioned in a region other than the region that includes at least that filament, which is enclosed, in a cross section perpendicular to the tube axis of the light emitting tube, by the tube wall of the light emitting tube and two circumscribed lines perpendicular to the filament.

The tenth aspect includes a filament lamp as described in any one of the first through the ninth aspects, in which the seal area is formed by putting a rod-shaped sealing insulator in place and, with multiple conductive pieces arrayed at intervals around the periphery of the sealing insulator, hermetically sealing the light emitting tube and the sealing insulator with the conductive pieces between them.

The eleventh aspect includes a light-irradiation-type heat treatment device fitted with a light source in which is located a filament lamp as described in any one of the first through the tenth aspects, the workpiece to be treated being heated by irradiation of the workpiece to be treated with light from that light source.

The twelfth aspect includes a light-irradiation-type heat treatment device fitted with a lamp unit in which are arrayed multiple filament lamps as described in any one of the first through the tenth aspects, the workpiece to be treated being heated by irradiation of the workpiece to be treated with light from that lamp unit.

Using the invention of the first aspect, advantageously, there is no likelihood of unwanted discharge between a filament and leads that are nearby in the direction perpendicular to the tube axis of the light emitting tube, and because the heat of the insulating wall is transferred to the light emitting tube and released to the air, the insulating tube does not reach a high temperature as in filament lamps of the related art, and so there is no likelihood that unwanted light other than from the filaments will be emitted. Moreover, the leads are located in lead accommodation spaces where they will not short circuit each other, and so it is possible to suppress unwanted discharge between adjacent leads. Advantageously, there is no likelihood that leads will melt through while the filament lamp is lit, and the filament lamp can be lit in a stable manner over a long period of time.

Using the inventions of the second and third aspects, the leads can be positioned in the desired positions with certainty, and because movement of the leads in the circumferential direction is regulated, even with repeated thermal expansion and contraction of the leads, the leads do not depart from their initial positions and the distribution of illuminance is not liable to change over time. Advantageously, the initial distribution of illuminance can be maintained for a long period of time.

Using the invention of the fourth aspect, leads can be reliably positioned in the desired positions, so that movement of the leads in the circumferential direction is regulated, even with repeated thermal expansion and contraction of the leads, and the leads do not depart from their initial positions. Moreover, because non-machining methods such as drawing or injection molding can be adopted, damage to light emitting tubes during manufacture of the filament lamps can be avoided and productivity can be increased.

Using the invention of the fifth aspect, light emitted by the filament is emitted without attenuation by the insulating wall, and so the desired heat treatment can be conducted without an excessive use of power in the filament.

Using the of the sixth aspect, light emitted by the filaments is not attenuated by the insulating wall, and so the desired heat treatment can be conducted without an excessive use of power in the filament. Moreover, the operation of passing the leads through the openings formed in the insulating wall and pulling them outward from the insulating wall during manufacture of the filament lamp can be facilitated by inserting the filaments into the inner tube.

Using the invention of the seventh and eighth aspects, thermal conduction from the insulating wall to the light emitting tube is promoted, and so it is possible to more reliably keep the insulating wall from reaching a high temperature and there is no likelihood of the emission of unwanted light other than from the filaments. In particular, the inner surface of the light emitting tube and the insulating wall are fused together along the tube axis of the light emitting tube, and so it is possible to increase the area of fusion of the light emitting tube and the inner wall and further encourage thermal conduction from the insulating wall to the light emitting tube. Moreover, even if the insulating wall reaches a higher temperature than the light emitting tube while the filament lamp is lit and the insulating wall expands more than the light emitting tube in the direction of the tube axis of the light emitting tube, the shearing force that works between the light emitting tube and the insulating wall is dispersed, and so there is no likelihood of damage to the fused area.

Using the invention of the ninth aspect, leads can be located in positions where there is no practical problem of shadows from the leads being cast on the workpiece to be treated, and so there is no likelihood of an adverse effect on the distribution of illuminance on the workpiece to be treated.

Using the invention of the tenth aspect, numerous conductive pieces can be placed on the periphery of the sealing insulator without contacting each other, and so even in a filament lamp that has numerous filaments to conduct highly precise temperature control for workpieces to be treated that have complex physical characteristics, it is possible to form a structure to feed power to the filament assemblies independently without enlarging the seal area.

Using the invention of the eleventh aspect, it is possible to realize light-irradiation-type heat-treatment equipment that cancels equipment-by-equipment variations of distribution of illuminance on the workpieces to be treated, by making use of the filament lamps described in any one of the first through ninth aspects.

Using the invention of the twelfth aspect, it is possible to realize light-irradiation-type heat-treatment equipment that cancels equipment-by-equipment variations of distribution of illuminance on the workpieces to be treated, by making use of lamp units in which are mounted the filament lamps described in any one of the first through ninth aspects.

BRIEF DESCRIPTION OF THE DRAWINGS

FIGS. 4(a)-4(c) are expanded perspective views within a seal area of FIG. 1 in accordance with the invention;

FIGS. 11(a)-11(c) are front cross-sectional views showing a filament lamp in accordance with another embodiment of the invention;

FIGS. 12(a)-12(b) are front cross-sectional views showing a filament lamp in accordance with another embodiment of the invention;

FIG. 18 is a perspective view of a known filament lamp.

DETAILED DESCRIPTION OF THE INVENTION

Figure 1:
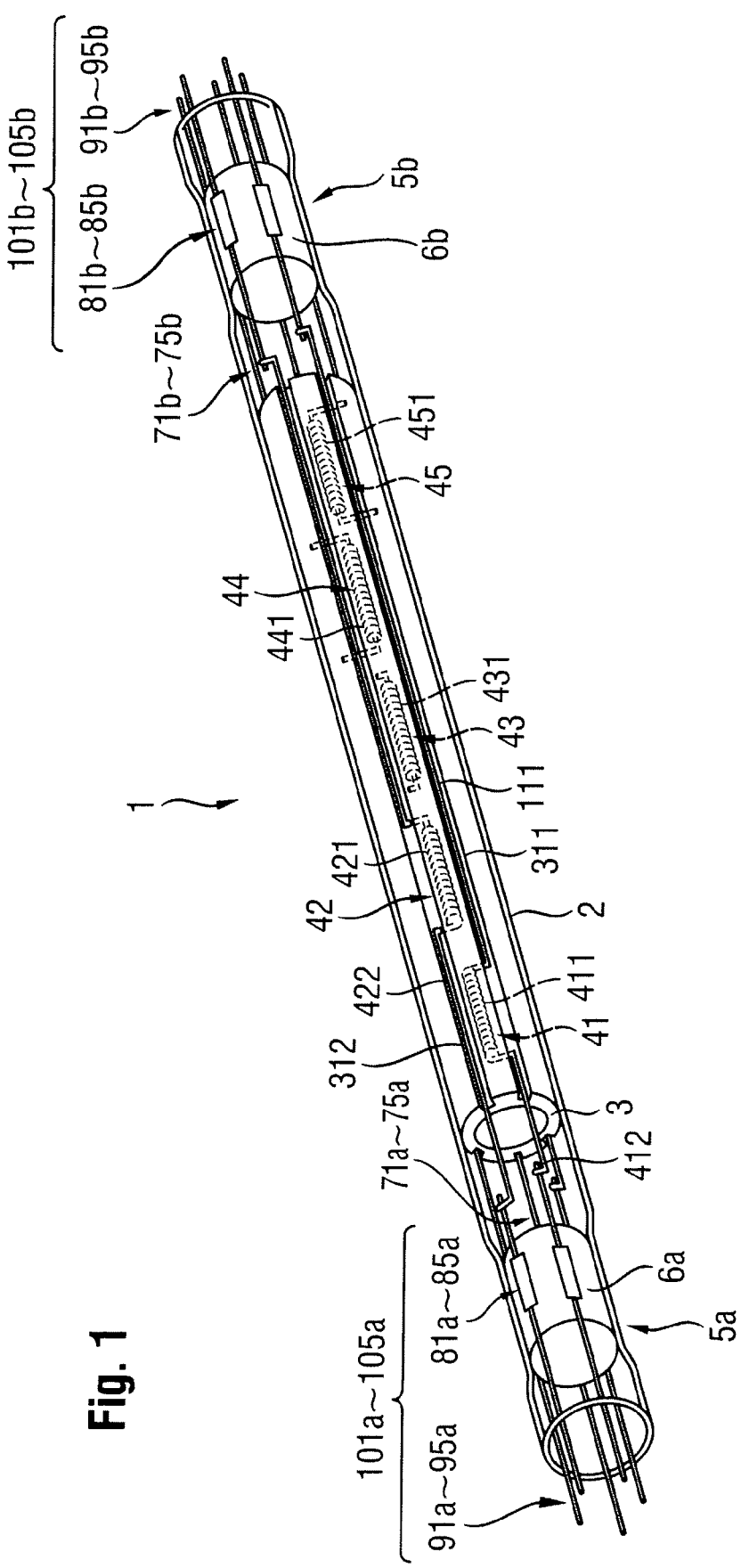
FIG. 1 is a perspective view showing the constitution of the filament lamp in accordance with the invention.

The first embodiment of this invention is explained using FIGS. 1 through 6. FIG. 1 is a perspective view showing the constitution of the filament lamp 1 involved in the invention of this embodiment. As shown in FIG. 1, the filament lamp 1 has a linear or other tubular light emitting tube 3, made of quartz glass or another light-transparent material. Air-tight seal areas 5a, 5b are formed by fusing sealing insulators 6a, 6b on the light emitting tube 2 at both ends of the light emitting tube 2. A tubular insulating wall/inner tube 3, made of quartz glass or another light-transparent material and shorter in length in the direction of the tube axis of the light emitting tube 2, is located on the same axis as the light emitting tube 2 in proximity to the inner surface of the light emitting tube 2 within the light emitting tube 2, in which is sealed a halogen gas. For example, five filament assemblies 41 to 45 are located within this inner tube, and filaments 411 to 451 of the filament assemblies 41 to 45 are arranged in order extending along the tube axis.

Figure 2:
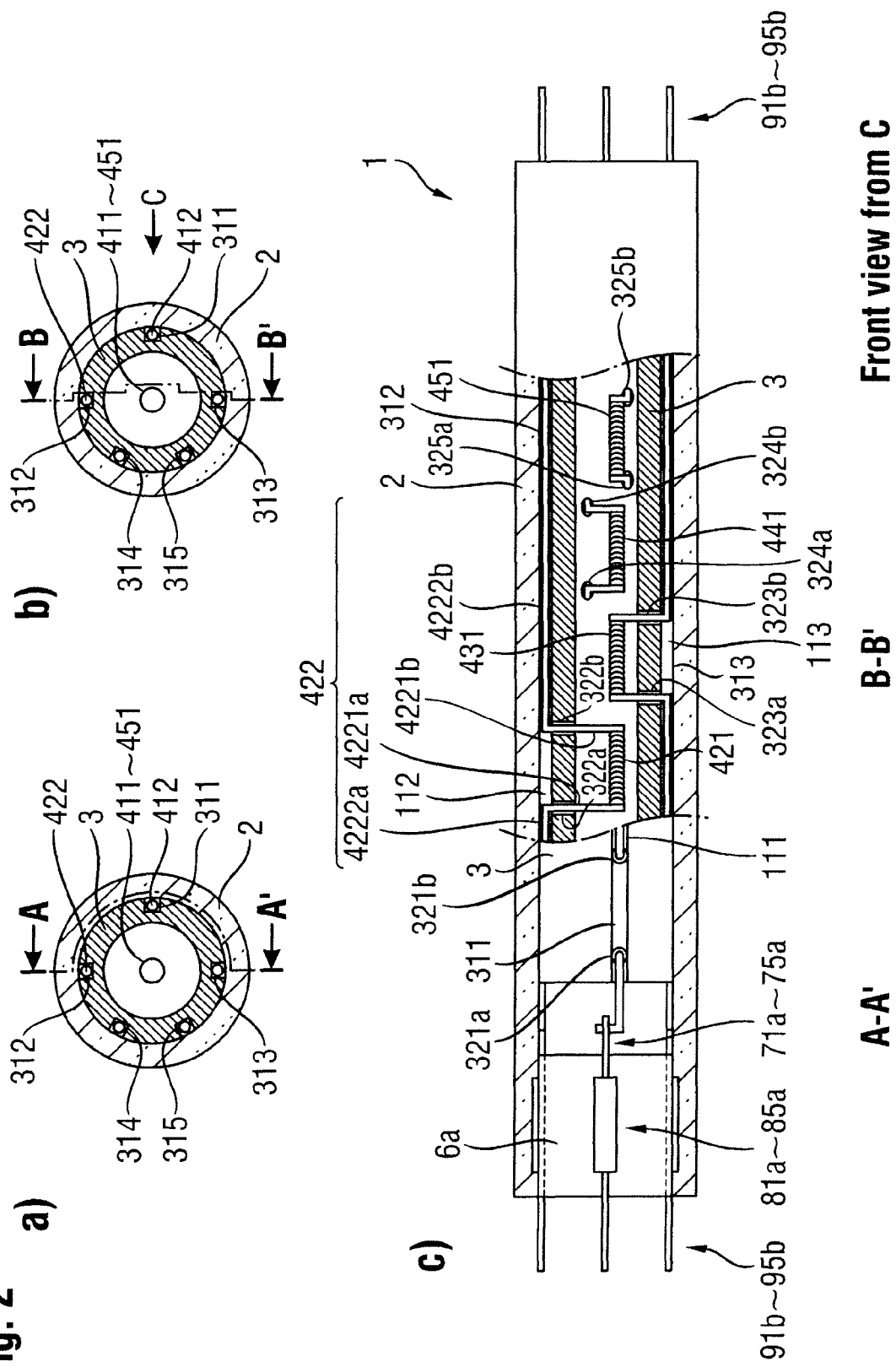
FIGS. 2(a)-2(c) show cross sections of the filament lamp of FIG. 1 in accordance with the invention.
Figure 3:
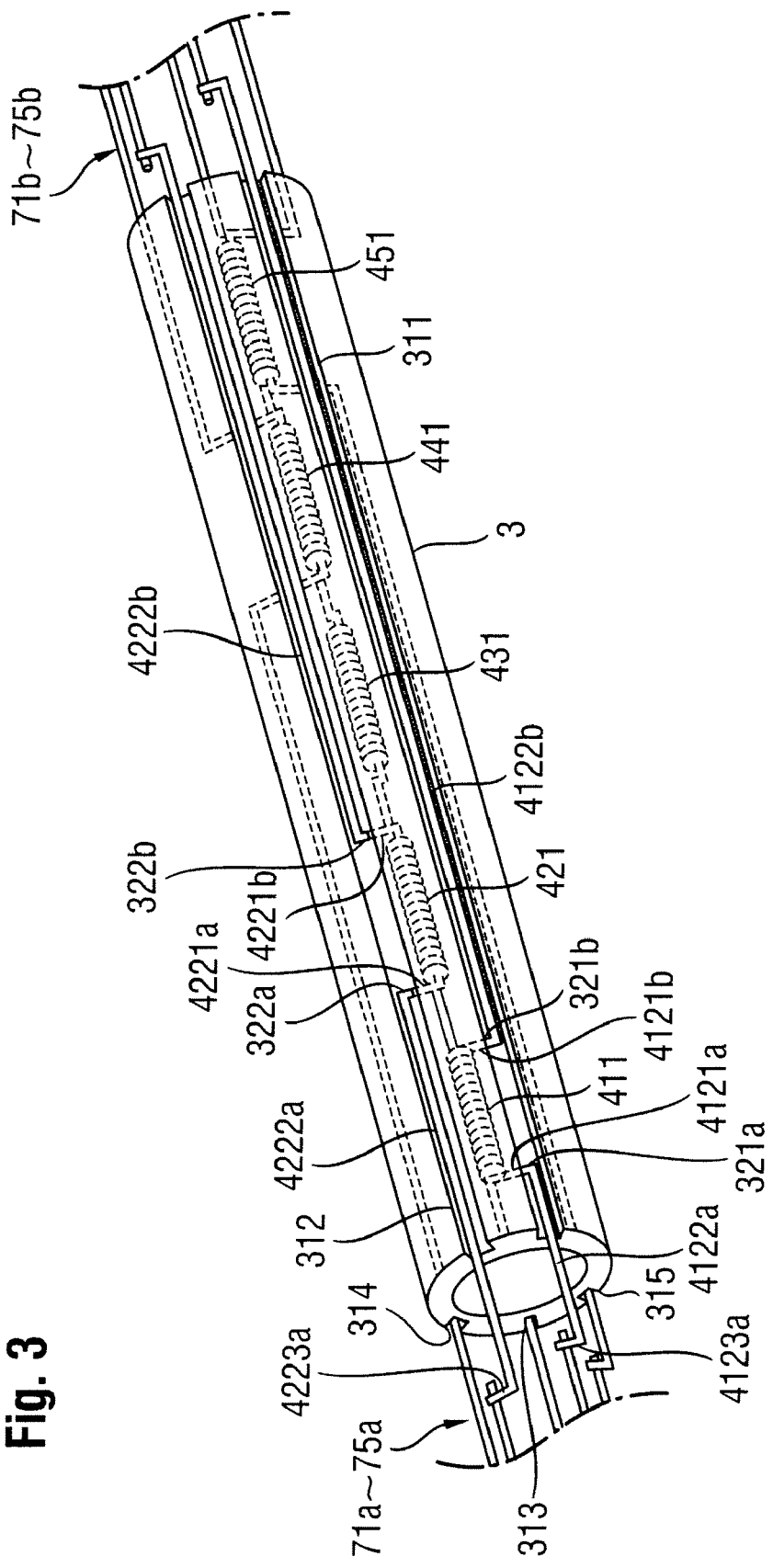
FIG. 3 is a perspective view showing filament assemblies with respect to an inner tube of the filament lamp of FIG. 1 in accordance with the invention.

FIGS. 2(a)-2(c) show cross sections of the filament lamp 1 of the invention of the first embodiment, cut across and along the tube axis, and FIG. 3 is a perspective view showing the filament assemblies 41 to 45 with respect to the inner tube 3 of the filament lamp 1. FIGS. 2(*a*) & 2(*b*) are cross sections of the filament lamp 1 cut in the radial direction. FIG. 2(*c*) shows a cross section of the filament lamp 1 cut along the direction of the tube axis at line A-A' in FIG. 2(*a*), and a cross section of the filament lamp 1 cut along the direction of the tube axis at line B-B' in FIG. 2(*b*), and a front view of the filament lamp 1 as seen from C in FIG. 2(*b*).

As shown in FIGS. 2 and 3, slots 311 to 315, the same in number as the filament assemblies 41 to 45, are formed in the outer surface of the inner tube 3, separated from each other in the circumferential direction and extending along the tube axis. So that the leads 412 to 415 connected to both ends of the filaments 411 to 451 can pass through, there are openings 321*a*, 321*b*, openings 322*a*, 322*b*, openings 323*a*, 323*b*, openings 324*a*, 324*b*, openings 325*a*, 325*b*, two for each filament, in the slots 311 to 315. In such an inner tube 3, slots 311 to 315 having openings 321*a*, 321*b*, openings 322*a*, 322*b*, openings 323*a*, 323*b*, openings 324*a*, 324*b*, openings 325*a*, 325*b* for the passage of leads 412 to 452 are formed by machining quartz glass molded in tubular shape.

Locating such an inner tube 3 in proximity to the inner surface of the light emitting tube 2 forms lead accommodation spaces 111 to 115 to accommodate the leads 412 to 452 of the filament assemblies 41 to 45, which are demarcated by the inner surface of the light emitting tube 2 and the slots 311 to 315 made in the inner tube 3.

The filament assemblies located in the inner tube 3 comprise coiled filaments 411 to 415 and power feed leads 412 to 452 that are connected to both ends of the filaments 411 to 415. The leads 412 to 452 comprise filament connectors 4121*a* to 4521*a*, 4121*b* to 4521*b* that are connected to both ends of the filaments 411 to 415 and extend perpendicular to the tube axis, lead horizontal parts 4122*a* to 4522*a*, 4122*b* to 4522*b* that are connected to the filament connectors 4121*a* to 4521*a*, 4121*b* to 4521*b* and extend along the tube axis, and internal lead connectors 4123*a* to 4523*a*, 4123*b* to 4523*b* that are connected to the lead horizontal parts 4122*a* to 4522*a*, 4122*b* to 4522*b* and extend in the direction perpendicular to the tube axis and also connect to the internal leads 71*a* to 75*a*, 71*b* to 75*b* that are fixed in the seal areas 5*a*, 5*b*. The number of filament assemblies 41 to 45 can be adjusted as is appropriate to the dimensions, physical characteristics, etc., of the workpiece to be treated.

The filament assemblies 41 to 45 are installed in the inner tube 3 such that all the filaments 411 to 415 are accommodated within the inner tube 3 and the filaments 411 to 415 are positioned on the central axis of the light emitting tube 2. For example, as shown in FIG. 3, in one set of leads connected to one end of the filaments 411 to 451, the filament connectors 4121*a* to 4521*a* extend in directions perpendicular to the tube axis and pass through the openings 321*a* to 325*a* in the slots 311 to 315 of the inner tube 3, and the lead horizontal parts 4122*a* to 4522*a* are positioned in the slots 311 to 315 of the inner tube 3 and project outward from the outer end face of the inner tube 3 along the tube axis toward one seal area 5*a*. Moreover, in the other set of leads connected to the other end of the filaments 411 to 451, the filament connectors 4121*b* to 4521*b* extend in directions perpendicular to the tube axis and pass through the openings 321*b* to 325*b* in the slots 311 to 315 of the inner tube 3, and the lead horizontal parts 4122*b* to 4522*b* are positioned in the same slots 311 to 315 of the inner tube 3 as the one set and project outward from the outer end face of the inner tube 3 along the tube axis toward the other seal area 5*b*.

The filaments 411 to 451 are supported within the inner tube 3, such that they do not contact the inner wall of the inner tube 3, for example, by ring-shaped anchors (not shown) that are fitted to press against the inner wall of the inner tube 3. One anchor is fixed as a single piece with each filament 411 to 451. By fitting such anchors, it is possible to prevent the occurrence of the problem of the inner tube 3 losing transparency due to contact between the inner wall of the inner tube 3 and the filaments 411 to 451 that reach high temperatures when lit.

The seal areas 5*a*, 5*b* formed at both ends of the light emitting tube 2 have a shrink seal structure formed to have a smaller outside diameter than other areas by inserting cylindrical sealing insulators 6*a*, 6*b* made of quartz glass, for example, inside the constituent material of the light emitting tube 2 and using such means as a burner to heat the outer surface of the constituent material of the light emitting tube 2. On the outer surface of the sealing insulator 6*a*, 6*b* a number of foils 81*a* to 85*a*, 81*b* to 85*b* equal to the number of filament assemblies 41 to 45, five for example, are placed at roughly equal intervals and parallel along the length of the sealing insulator 6*a*, 6*b*. To avoid folding, foils 81*a* to 85*a*, 81*b* to 85*b* that are shorter than the sealing insulators 6*a*, 6*b* are used.

In the seal areas 5*a*, 5*b*, the internal leads 71*a* to 75*a*, 71*b* to 75*b* that are connected to the leads 412 to 452 of the filament assemblies 41 to 45 are fixed and connected to the metal foils 81*a* to 85*a*, 81*b* to 85*b*. For the internal leads 71*a* to 75*a*, 71*b* to 75*b*, their base ends are embedded in the seal areas 5*a*, 5*b* and are connected, by welding, for example, to the tip ends of the metal foils 81*a* to 85*a*, 81*b* to 85*b*, and their tip ends that project into the light emitting tube 2 are connected, by welding, for example, to the leads 412, 452 of the filament assemblies 41 to 45. For the external leads 91*a* to 95*a*, 91*b* to 95*a*, their tip ends are embedded in the seal areas 5*a*, 5*b* and are connected by welding, for example, to the base ends of the metal foils 81*a* to 85*a*, 81*b* to 85*b*, and their base ends project outward from the ends of the light emitting tube 2 in the direction of the tube axis. The internal leads 71*a* to 75*a*, the metal foils 81*a* to 85, and the external leads 91*a* to 95*a* make up the conductive pieces 101*a* to 105*a*, and the internal leads 71*b* to 75*b*, the metal foils 81*b* to 85*b*, and the external leads 91*b* to 95*b* make up the conductive pieces 101*b* to 105*b*.

FIG. 4(*a*) is an expanded perspective view within the seal area 5*a* shown in FIG. 1. FIG. 4(*b*) is a cross section within the seal area 5*a* taken at line A-A' of FIG. 4(*a*), and FIG. 4(*c*) is a cross section within the seal area 5*a* taken at line B-B' of FIG. 4(*a*).

Using FIG. 4(*a*) to explain the constitution within the seal area 5*a* in greater detail, multiple slots 611*a* to 615*a* that are separated from each other in the circumferential direction and extend in the lengthwise direction of the sealing insulator 6*a* on the side of the filament assemblies 41 to 45 and multiple slots 621*a* to 625*a* that are separated from each other in the circumferential direction and extend in the lengthwise direction of the sealing insulator 6*a* on the side of the external leads 91*a* to 95*a* are formed on the sealing insulator 6*a*, and by which means high areas are formed to position the internal leads 71*a* to 75*a* and the external leads 91*a* to 95*a*. The internal leads 71*a* to 75*a* are placed along the slots 611*a* to 615*a* so that the outer end faces on the base ends are in contact with the high areas, and the external leads 91*a* to 95*a* are placed along the slots 621*a* to 625*a* so that the outer end faces on the tip ends are in contact with the high areas. By this means, the outermost faces of the internal leads 71*a* to 75*a* and the external leads 91*a* to 95*a* are positioned at the same circumference as the trunk of the sealing insulator 6*a*. The internal leads 71*a* to 75*a* and the external leads 91*a* to 95*a* positioned in this way are connected to the metal foils 81*a* to 85*a* that are located on the periphery of the trunk of the sealing insulator 6*a*. The external leads 91*a* to 95*a* that project from the end face of the light emitting tube 2 are connected to a power supply (not shown) and feed power independently to the filaments 411 to 451 of the filament assemblies 41 to 45, by which means it is possible to control the lighting of each filament 411 to 451 individually. The constitution within the seal area 5b is the same as that within the seal area 5a explained above.

Thus, the sealing insulators 6a, 6b are placed inside the light emitting tube 2 and the seal areas 5a, 5b are formed, by which means the periphery of the cylindrical sealing insulators 6a, 6b can be used to put numerous metal foils 81a to 85a, 81b to 85b in place without contacting each other. Consequently, it is possible to reliably form a structure to feed power to each filament assembly 41 to 45 independently without enlarging the seal areas 5a, 5b, even when the filament lamp 1 has numerous filament assemblies 41 to 45. In particular, in comparison with the formation of flat seals by the pinch seal method, the size of the seal area can be made smaller even if numerous metal foils are present, advantageously, preferable from the perspective of conserving space.

Using a filament lamp 1 that has seal areas 5a, 5b constituted with this sort of sealing insulator 6a, 6b, the filaments 412 to 452 of the filament assemblies 41 to 45 located in the slots 311 to 315 of the inner tube 3 are fixed in place relative to the internal leads 71a to 75a, 71b to 75b that have been fixed in the slots 611a to 615a, 611b to 615b made in the sealing insulators 6a, 6b. It is possible, therefore, to regulate rotation of the inner tube 3 in the circumferential direction, even if the filament lamp 1 is subjected to vibration or shocks during transportation or while lighting. In particular, if the leads 412 to 452 that project from the end faces of the inner tube 3 toward the seal areas 5a, 5b contract in length, rotation of the inner tube 3 in the circumferential direction can be reliable stopped, and so it is preferable that the end face of the inner tube, rather than the end faces on the seal area side of the end-most two filaments among the five filament assemblies 41 to 45 arranged along the tube axis, be located toward the seal areas.

In this sort of filament lamp 1, for any filament (e.g., filament 411), all of the leads (e.g., leads 422 to 452) of the filaments (e.g., filaments 421 to 451) other than that filament (e.g., filament 411) are preferably positioned within a specified region within the light emitting tube 2. A specific example is explained below using FIG. 5.

Figure 5:
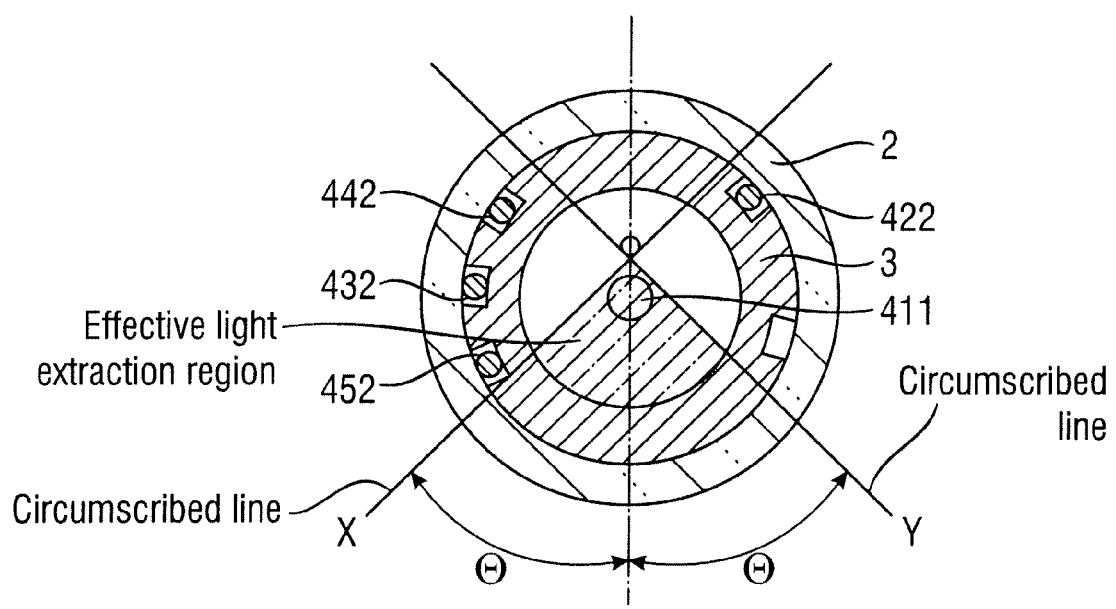
FIG. 5 is a cross section of the filament lamp of FIG. 1 in accordance with the invention.

FIG. 5 is a cross section of the filament lamp 1, cut in the radial direction, of the invention of this embodiment, used to explain the positional relationship between the filaments 411 to 451 and the leads 412 to 452. In a cross section of which the plane is perpendicular to the central axis of, for example, the filament 411, as shown in FIG. 5, all of the leads 422 to 452 of the filaments 421 to 451 other than that filament 411 are positioned outside the region (also referred to as "effective light extraction region" hereafter) that is bounded by the tube wall of the light emitting tube 2 and two circumscribed lines X, Y that are perpendicular to the filament 411, which is the region within which at least the filament 411 is included. Further, the leads 412 to 452 of the filaments 411 to 451 are located as symmetrically as possible with respect to the filaments 411 to 451, and the leads 412 to 452 are not present in the region opposite the effective light extraction region either.

In order to realize such a positional relationship between the filaments 411 to 451 and the leads 412 to 452, slots 311 to 315 are formed in the inner tube 3 that is located within the light emitting tub 2 only in regions other than the region that is bounded by the tube wall of the light emitting tube 2 and two circumscribed lines X, Y that are perpendicular to the filament 411, which is the region within which at least the filaments 411 to 451 are included. In the sealing insulators 6a, 6b, moreover, the slots 611a to 615a, 611b to 615b in which the internal leads 71a to 75a, 71b to 75b are located are formed to correspond to the slots 311 to 315 in the inner tube 3.

By means of realization of such a positional relationship between the filaments 411 to 451 and the leads 412 to 452, it is possible to extract effectively the light directly emitted by a filament (e.g., the filament 411) without it being blocked by the leads (e.g., the leads 422 to 452) of the other filaments (e.g., the filaments 421 to 451), and so the distribution of illuminance on the workpiece to be treated is not liable to deteriorate due to shadows that leads (e.g., the leads 422 to 452) cast on the workpiece to be treated. In a filament lamp 1 constituted such that there are four or more filament assemblies 41 to 45 located in the light emitting tube 2 and the angle made by the circumscribed lines common to the filaments 411 to 451 and the leads 412 to 452 is from 10° to 60° in particular, the effect of shadows of the leads 412 to 452 cast on the workpiece to be treated would be marked, and so it is particularly effective to place the filaments 411 to 451 and the leads 412 to 452 so as to fulfill the positional relationship described above. A numerical example of such a filament lamp 1 is presented below.

The light emitting tube 2 has an outside diameter from 10 mm to 40 mm and a length from several tens of mm to about 800 mm, depending on the size of the workpiece to be treated, the distance from the filament lamp 1 to the workpiece to be treated, and the placement of the lamps within the lamp units. The filament assemblies 41 to 45 use solid wire of about 0.05 mm to 1 mm. In the event that this embodiment irradiates a 300 mm diameter silicon wafer from a distance of 50 mm, the light emitting tube 2 is 28 mm in diameter and 560 mm long, filament wire with a diameter of 0.5 mm is used, and connected to both ends of the filaments 411 to 451 that are 140 mm at the longest and are formed with an outside diameter of 8 mm are leads 412 to 452 that have a larger diameter than the filament wire, for example 0.8 mm. Now, the outside diameter of the filament is not restricted to 8 mm; depending on the required power and the filament temperature, and it can be from about 0.4 mm to about 20 mm. The maximum rated current value per filament is decided in accordance with the required temperature rise characteristics of the workpiece to be treated and permissible current value of the metal foil in the seal area (e.g.; it is 25 A in this embodiment).

The inner tube 3, in this embodiment, has an outside diameter from 24 mm to 24.5 mm and a length from 400 mm to 470 mm, wherein the gap from the inner surface of the light emitting tube 2 is preferably 0.7 mm or less. In the gap between the outer surface of the inner tube 3 and the inner surface of the light emitting tube 2, the lead accommodation spaces 111 to 115 are formed by the slots 311 to 315 of the inner tube 3 and the inner surface of the light emitting tube 2, so it must at least be smaller than the outside diameter of the leads 412 to 452, but considering the effect of thermal conductivity, it is particularly desirable that it be 0.5 mm or less with respect to the outer diameter of the light emitting tube 2. Further, the slots 311 to 315 made in the inner tube 3 are formed with a width of 1.0 mm to 1.5 mm, a depth of 1.3 mm to 1.6 mm, and a separation of at least 2 mm from each other. The separation between adjacent slots 311 to 315 is set greater than for the discharge-startup voltage, and so that the leads 412 to 452 are kept in a region other than the effective light extraction region. In the case of this embodiment, the lamp was filled with argon gas at a pressure of 0.5 atmosphere, so the separation between the slots 311 to 315 has to be at least 0.5 mm so that the lamp can be used without discharge at the commercial power of 200 V (e.g., 1 mm or more is preferable in consideration of a safety margin). In order to keep the leads 412 to 452 in a region other than the effective light extraction region, a separation of 7.5 mm or less is preferable in the event that three leads 432, 442, 452 are placed on one side of an inner tube with an outside diameter of 24 mm, as shown in the left half of FIG. 5.

In the event that either the outer surface of the inner tube 3 is in contact with the inner surface of the light emitting tube 2 or the gap between the outer surface of the inner tube 3 and the inner surface of the light emitting tube 2 is 0.5 mm or less, when the inner tube 3 is irradiated with light emitted by the filaments 411 to 451, heat from the inner tube 3 is transferred to the light emitting tube 2 that is close to the inner tube 3, and so it is possible to reliably prevent the inner tube 3 from reaching a high temperature. If the separation between adjacent slots 311 to 315 formed in the inner tube 3 is 1 mm or greater, unwanted discharge between the adjacent leads 412 to 452 can be reliably prevented.

As stated above, using the filament lamp 1 of the invention of this embodiment, power basically can be fed independently to multiple filaments 411 to 451 by way of conductive pieces 101a to 105a, 101b to 105b, and so it is possible to heat the workpiece to be treated evenly, even if the distribution of the extent of localized temperature change on the workpiece being treated is non-symmetrical with respect to the shape of the substrate, and so it is possible to realize a uniform temperature distribution across the entire workpiece to be treated.

In addition, the inner tube 3 is located in proximity to the inner surface of the light emitting tube 2, so that the tubular insulating wall 3 can be prevented from reaching a high temperature when the filament lamp 1 is lit. It is possible, therefore, to reliably eliminate the problem of emission of unwanted light other than from the filaments 411 to 415.

Further, the inner tube 3 is interposed between the filaments 411 to 415 and the leads 412 to 452; the leads 412 to 452 of the filament assemblies 41 to 45 are located in the lead accommodation spaces 111 to 115 demarcated by the inner surface of the light emitting tube 2 and the slots 311 to 315 in the inner tube 3 where they will not short circuit, and so the occurrence of unwanted discharge between a filament (e.g., the filament 411) and the leads (e.g., leads 422 to 452) in proximity to that filament (e.g., the filament 411), or between adjacent leads 412 to 452 can be reliably prevented.

Moreover, the leads 412 to 452 of the filament assemblies 41 to 45 are located in the lead accommodation spaces 111 to 115 demarcated by the inner surface of the light emitting tube 2 and the slots 311 to 315 in the inner tube 3, and so even with repeated thermal expansion and contraction of the leads 412 to 415 when the filament lamp 1 is lit, the leads 412 to 415 will not slip from their original position because movement of the leads 412 to 415 in the circumferential direction is regulated. Therefore, the distribution of illuminance is not liable to change over time, and so the initial distribution of illuminance can be maintained for a long time period.

Figure 6:
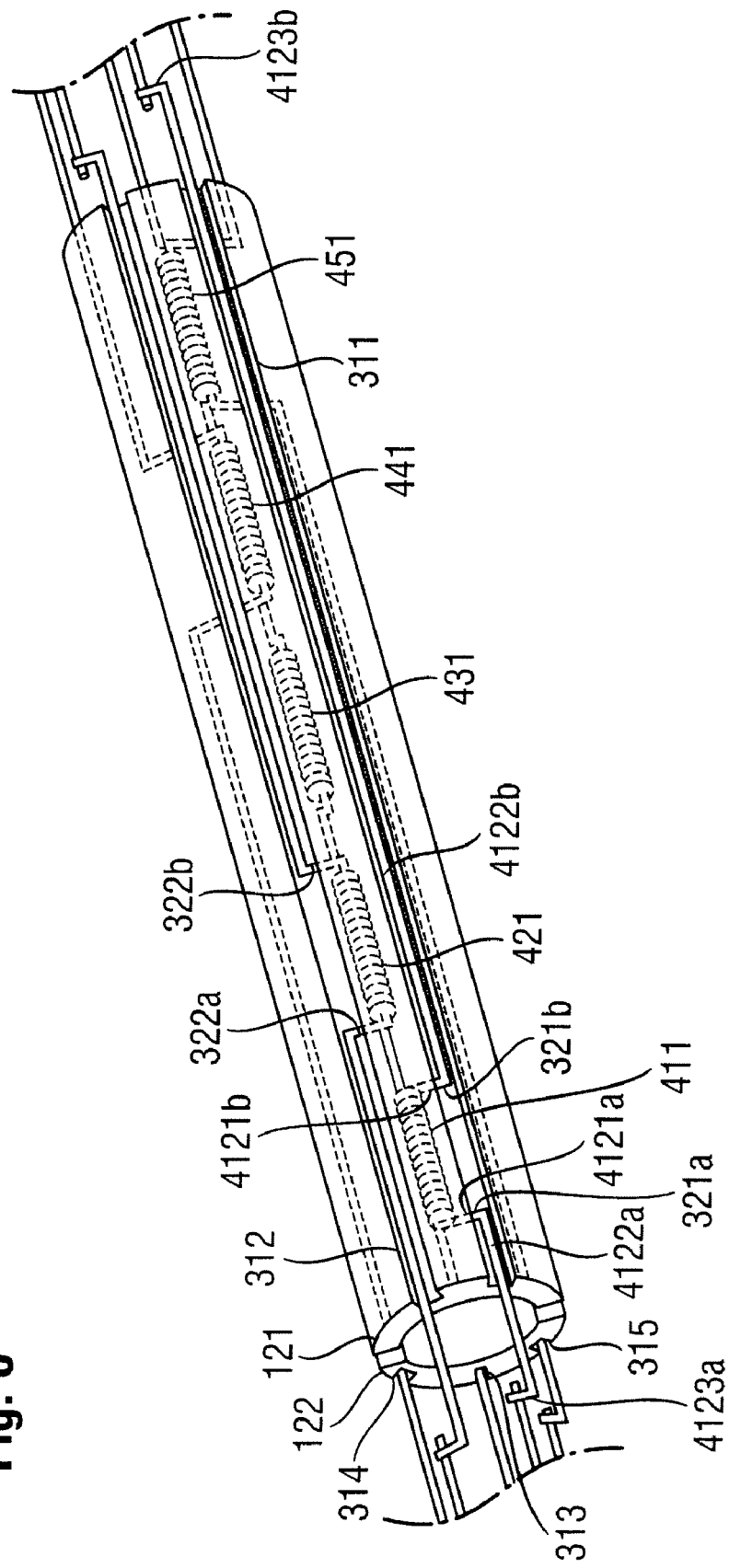
FIG. 6 is a perspective view showing the placement of the filament assemblies in accordance with the invention.

FIG. 6 shows a constitution that can be adopted in the filament lamp 1 of the invention of the first embodiment, wherein FIG. 6 is a perspective view showing the placement of the filament assemblies 41 to 45 with respect to inner tube constituent members 121, 122. As shown in FIG. 6, inner tube constituent members 121, 122, which are in the shape of half cylinders cut in the radial direction, segmented in two parts in the radial direction, are in proximity to the inner surface of the light emitting tube 2 instead of the inner tube 3 shown in FIG. 3. Two slots 311, 312 that extend along the tube axis and are separated in the circumferential direction are formed on the outer surface of one inner tube constituent member 121. Similarly, three slots 313, 314, 315 that extend along the tube axis and are separated in the circumferential direction are formed on the outer surface of the other inner tube constituent member 122. Two openings 321a, 321b, openings 322a, 322b, openings 323a, 323b, openings 324a, 324b, openings 325a, 325b, are formed in each of the slots 311 to 312, 313 to 315 made in the inner tube constituent members 121, 122.

Using multiply divided inner tube constituent members 121, 122 in this way, it is possible to perform separately for each inner tube constituent member 121, 122 the work of passing the leads 412 to 452 of the filament assemblies 41 to 45 through the openings 321a, 321b, openings 322a, 322b, openings 323a, 323b, openings 324a, 324b, and openings 325a, 325b made in the slots 311 to 312, 313 to 315 of the inner tube constituent members 121, 122. In filament lamps 1 that have numerous filament assemblies 41 to 45, therefore, the work of passing the leads 412 to 452 of the filament assemblies 41 to 45 through the openings 321a, 321b, openings 322a, 322b, openings 323a, 323b, openings 324a, 324b, and openings 325a, 325b made in the slots 311 to 312, 313 to 315 of the inner tube constituent members 121, 122 can be done with good efficiency, as compared to a tubular inner tube 3 that is not multiply divided. By placing one inner tube constituent member 121 and the other inner tube constituent member 122 inside the light emitting tube 2 with a gap between them, if the inner tube constituent members 121, 122 expand in the circumferential direction while the filament lamp 1 is lit, the expansion is absorbed by the space between the facing inner tube constituent members 121, 122, and so it is possible to reliably prevent damage to the inner tube constituent members 121, 122.

The second embodiment of this invention is explained using FIGS. 7(a)-7(c), which are front cross-sectional views showing the filament lamp 1 of the invention of this embodiment, sectioned across and along the tube axis. FIGS. 7(a) & 7(b) are cross sections of the filament lamp 1 cut in the radial direction. FIG. 7(c) has a cross section of the filament lamp 1 cut along the direction of the tube axis at line A-A' in FIG. 7(a), a cross section of the filament lamp 1 cut along the direction of the tube axis at line B-B' in FIG. 7(b), and a front view of the filament lamp 1 as seen from C in FIG. 7(b).

As shown in FIGS. 7(a)-7(c), the filament lamp 1 of the invention of this embodiment is not limited to the mode of lead accommodation spaces 111 to 115 formed by multiple slots 311 to 315 in the inner tube 3 and the inner surface of the light emitting tube 2, like the filament lamp 1 of the invention of the first embodiment. In this filament lamp 1, multiple slots 131 to 135 are formed in the inner surface of the light emitting tube 13, extending along the tube axis and separated from each other in the circumferential direction. By placing an inner tube 14 close to the inner surface of this light emitting tube 13, one forms multiple lead accommodation spaces 111 to 115 demarcated by the slots 131 to 135 of the light emitting tube 13 and the outer surface of the inner tube 14. The slots 131 to 135 formed in the inner surface of the light emitting tube 13 satisfy the positional relationship between a filament (e.g., the filament 411) and the leads (e.g., leads 422 to 452) of the filaments (e.g., the filaments 421 to 451) other than that filament (e.g., the filament 411), and as explained with respect to FIG. 5.

Two openings 141a, 141b, openings 142a, 142b, openings 143a, 143b, openings 144a, 144b, and openings 145a, 145b for the passage of leads 412 to 452 are made in the inner tube 14 at points corresponding to each of the slots 131 to 135 in the light emitting tube 13. The inner tube 14 can be constituted without slots in its outer surface, or it can be constituted with slots in its outer surface corresponding to the slots 131 to 135 in the light emitting tube 13.

The filament assemblies 41 to 45 have all their filaments 411 to 451 accommodated within the inner tube 14, wherein the filaments 411 to 451 are mounted in the inner tube 14 so that they are positioned on the central axis of the light emitting tube 13. That is, the filament connectors 4121a to 4521a of one set of leads connected to one end of the filaments 411 to 451 extend in a direction perpendicular to the tube axis and pass through the openings 141a to 145a in the inner tube 14, and the lead horizontal parts 4122a to 4522a of the one set of leads are placed in the slots 131 to 13 of the light emitting tube 13 and extend outward in the direction of the tube axis from the end face of the inner tube 14 toward the one seal area 5a. Moreover, the filament connectors 4121b to 4521b of the other set of leads connected to the other end of the filaments 411 to 451 extend in a direction perpendicular to the tube axis and pass through the openings 141b to 145b in the inner tube 14, and the lead horizontal parts 4122b to 4522b of the other set of leads are placed in the slots 131 to 13 of the light emitting tube 13 and extend outward in the direction of the tube axis from the end face of the inner tube 14 toward the other seal area 5b, as shown in FIGS. 7(a)-7(c).

As described above, using the filament lamp 1 of the invention of the second embodiment, basically the same results can be anticipated as with the filament lamp 1 of the invention of the first embodiment. Moreover, the light emitting tube 13 that has slots 131 to 135 on its inner surface can be constituted by the methods of drawing or injection molding. Advantageously, it is not necessary to form the slots on the inner surface of the light emitting tube 13 by a subsequent mechanical process such as machining, and so it is possible to reduce the cost and effort required in production and the risk of damage during machining.

Figure 8:
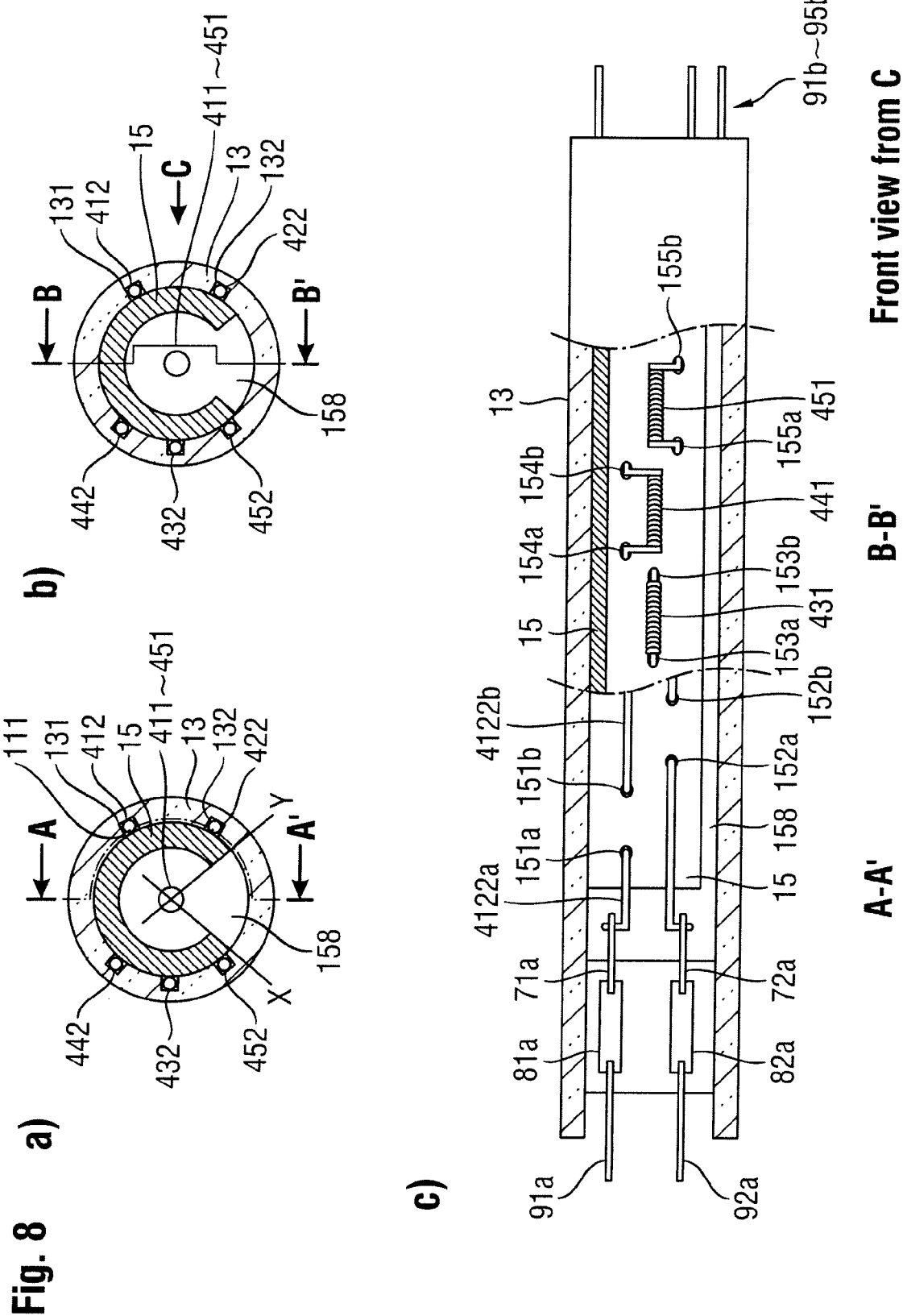
FIGS. 8(a)-8(c) are front cross-sectional views showing a filament lamp in accordance with another embodiment of the invention.

The third embodiment of this invention is explained using 8(a)-8(c), which are front cross-sectional views showing the filament lamp 1 of the invention of this embodiment, sectioned across and along the tube axis. FIGS. 8(a) & 8(b) are cross sections of the filament lamp 1 cut in the radial direction. FIG. 8(c) has a cross section of the filament lamp 1 cut along the direction of the tube axis at line A-A' in FIG. 8(a), a cross section of the filament lamp 1 cut along the direction of the tube axis at line B-B' in FIG. 8(b), and a front view of the filament lamp 1 as seen from C in FIG. 8(b).

As shown in FIGS. 8(a)-8(c), in the filament lamp 1, multiple slots 131 to 135 are formed in the inner surface of the light emitting tube 13, extending along the tube axis and separated from each other in the circumferential direction. By placing an inner tube 15 close to the inner surface of this light emitting tube 13, one forms multiple lead accommodation spaces 111 to 115 demarcated by the slots 131 to 135 of the light emitting tube 13 and the outer surface of the inner tube 15. The slots 131 to 135 formed in the inner surface of the light emitting tube 13 satisfy the positional relationship between a filament (e.g., the filament 411) and the leads (e.g., leads 422 to 452) of the filaments (e.g., the filaments 421 to 451) other than that filament (e.g., the filament 411), as explained with respect to FIG. 5.

Moreover, the inner tube 15 of the filament lamp 1 has an opening 158 that is "C" shaped in a cross section perpendicular to the tube axis extending along the tube axis of the light emitting tube 13 on the light extraction side. Two openings 151a, 151b, openings 152a, 152b, openings 153a, 153b, openings 154a, 154b, and openings 155a, 155b for the passage of leads 412 to 452 of the filament assemblies 41 to 45 are made in the inner tube 15 at points corresponding to each of the slots 131 to 135 in the light emitting tube 13. Further, the edges of the opening 158 are positioned in a region other than the effective light extraction region described with respect to FIG. 5. Specifically, the opening 158 is formed in the inner tube 15 such that an angle of 80° to 90° is formed by the straight circumscribed lines X, Y that connect the filaments 411 to 451 to the edges of the opening in the inner tube 15.

Figure 7:
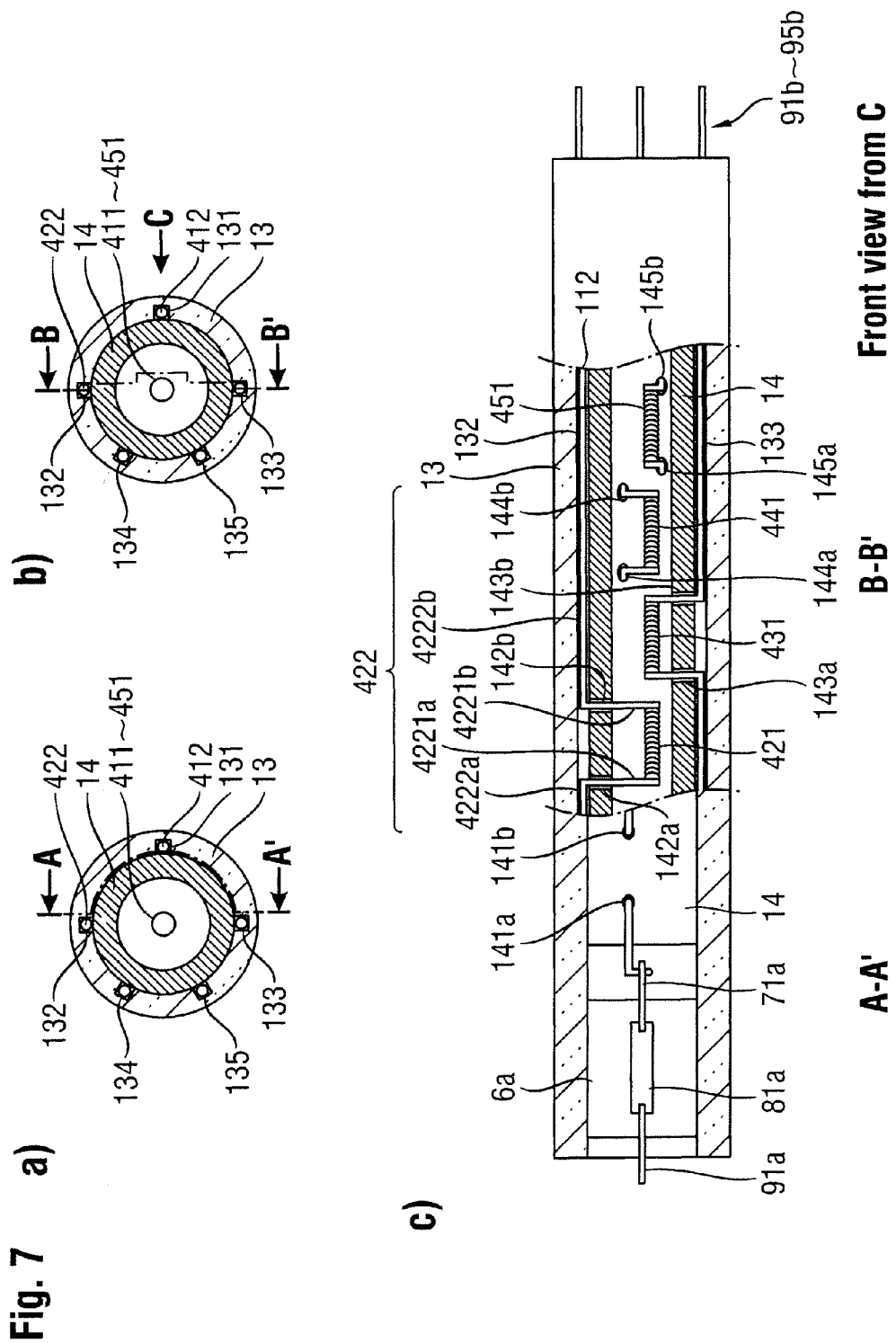
FIGS. 7(a)-7(c) are front cross-sectional views showing a filament lamp in accordance with another embodiment of the invention.

The method of installing the filament assemblies 41 to 45 of this filament lamp 1 is similar to that of the filament lamp 1 of the second embodiment described with respect to FIG. 7. However, instead of forming the slots in the inner surface of the light emitting tube 13, it is possible to form the slots in the outer surface of the inner tube 15, as shown in FIGS. 8(a)-8(c).

As stated above, using the filament lamp 1 of the invention of the third embodiment, basically the same results can be anticipated as with the filament lamp 1 of the invention of the first embodiment. Moreover, because the light emitted by the filaments 411 to 451 is not absorbed or reflected by the inner tube 15, the power used in the filaments 411 to 451 can be minimized.

FIGS. 9(a)-9(c) are front cross-sectional views showing the filament lamp 1 of the invention of this embodiment, sectioned across and along the tube axis. FIG. 9(a) is a cross section of the filament lamp 1 cut in the radial direction at line A-A' in FIG. 9(c), and FIG. 9(a) is a cross section of the filament lamp 1 cut in the radial direction at line B-B' in FIG. 9(c). FIG. 9(c) has a cross section of the filament lamp 1 cut along the direction of the tube axis at line P-P' in FIG. 9(a), a cross section of the filament lamp 1 cut along the direction of the tube axis at line Q-Q' in FIG. 9(b), a cross section of the filament lamp 1 cut along the direction of the tube axis at line R-R' in FIG. 9(b) and a front view of the filament lamp 1 as seen from S in FIG. 9(a).

As shown in FIGS. 9(a)-9(c), this filament lamp 1 has five filament assemblies 41 to 45 located within a linear light emitting tube 16 that is square in a cross section taken perpendicular to the tube axis. The filaments 411 to 451 of the filament assemblies 41 to 45 extend along the tube axis and are arrayed in order in the direction of the tube axis, and the leads 412 to 451 of the filament assemblies 41 to 45 are located along the inner walls on both sides of the light emitting tube 16. Seal areas 5a, 5b on both ends of the light emitting tube 16 are formed with a cross section that is circular in the direction perpendicular to the tube axis, like the seal areas 5a, 5b described in the first through third embodiments. A pair of insulating walls 171, 172 that are rectangular in a cross section perpendicular to the tube axis and that extend along the tube axis of the light emitting tube 16, with the filaments 411 to 451 sandwiched and separated, are located within the light emitting tube 16. The insulating walls 171, 172 are made of an insulating material such as quartz glass, and are located along the inner walls on both sides of the light emitting tube 16, between the filaments 411 to 451 and the leads 412 to 452.

The constitution of this filament lamp 1 is explained below in greater detail. Multiple slots 1611 to 1612, and 1621 to 1623 to position the leads 412 to 452 of the filament assemblies 41 to 45 are formed in the inner surface of the light emitting tube 16, and which extend along the tube axis and are separated in the circumferential direction. These slots 1611 to 1612, and 1621 to 1623 fulfill the positional relationship between a filament (e.g., the filament 411) and the leads (e.g., leads 422 to 452) of the filaments (e.g., the filaments 421 to 451) other than that filament (e.g., the filament 411), as explained with respect to FIG. 5. The insulating walls 171, 172 have two openings 1711a, 1711b, openings 1712a, 1712b, openings 1721a, 1721b, openings 1722a, 1722b, and openings 1723a, 1723b made at points corresponding to each of the slots 1611 to 1612, and 1621 to 1623 in the light emitting tube 16, and with their outer edges in the direction perpendicular to the tube axis located in the light emitting tube 16 so that they are positioned in regions other than the effective light extraction region described with respect to FIG. 5.

Slots 1611 to 1612, and 1621 to 1623 to position the leads 412 to 452 are formed on the inner surfaces within the light emitting tube 16, by which means a paired first concave/ convex surface 161 and second concave/convex surface 162 with shapes that are uneven in cross section perpendicular to the tube axis face two sides with the filaments 411 to 451 between them. There are provided in the light emitting tube 16, in addition to the first concave/convex surface 161 and second concave/convex surface 162, slots 1631 to 1632, and 1641 to 1642 to position the insulating walls 171, 172, by which means a paired third concave/convex surface 163 and fourth concave/convex surface 164 with shapes that are uneven in cross section perpendicular to the tube axis face two sides with the filaments 411 to 451 between them. In the direction perpendicular to the tube axis, the concave/convex surfaces formed on the third concave/convex surface 163 and fourth concave/convex surface 164 face across a gap that is slightly narrower than the width of the insulating walls 171, 172 in the direction perpendicular to the tube axis.

The insulating walls 171, 172 are placed with the edges in the direction perpendicular to the tube axis adjoining concave portions of the third concave/convex surface 163 and the fourth concave/convex surface 164. One pair of edges adjoins convex portions of the third concave/convex surface 163 and the fourth concave/convex surface 164, and the other edges adjoin the first concave/convex surface 161 and the second concave/convex surface 162. Rotation in the circumferential direction within the light emitting tube 16 is regulated by this means. Within the light emitting tube 16, the insulating walls 171, 172 are placed to cover all the slots 1611 to 1612, and 1621 to 1623 made in the first concave/convex surface 161 and the second concave/convex surface 162, by which means lead accommodation spaces 111 to 115 to accommodate the leads 412 to 452 of the filaments 411 to 451 are formed and demarcated by the slots 1611 to 1612, and 1621 to 1623 in the inner surface of the light emitting tube 16 and the other edges of the insulating walls 171, 172.

The filament assemblies 41 to 45 are installed with the insulating walls 171, 172 on both sides and the filaments 411 to 451 on the center line of the light emitting tube 16, in the following manner. For example, as shown in FIGS. 9(a)-9(c), the filament connectors 4121a to 4521a of one set of leads connected to one end of the filaments 411 to 451 extend in a direction perpendicular to the tube axis and pass through one set of openings 1711a to 1712a, and 1721a to 1723a in the insulating walls 171, 172, and the lead horizontal parts 4122a to 4522a of one set of leads is placed in the slots 1611 to 1612, and 1621 to 1623 on the inner surface of the light emitting tube 16 and project outward in the direction of the tube axis from the ends of the insulating walls 171, 172 toward one seal area 5a. Moreover, the filament connectors 4121b to 4521b of the other leads connected to the other end of the filaments 411 to 451 extend in a direction perpendicular to the tube axis and pass through the other openings 1711b to 1712b, and 1721b to 1723b in the insulating walls 171, 172, and the lead horizontal parts 4122b to 4522b of the other leads is placed in the slots 1611 to 1612, and 1621 to 1623 on the inner surface of the light emitting tube 16 and project outward in the direction of the tube axis from the ends of the insulating walls 171, 172 toward the other seal area 5b.

Examples of numerical values for such a filament lamp are explained below. For example, the numerical values for the filaments 411 to 451 and the leads 412 to 452 of the filament assemblies 41 to 45 are similar to the filament lamp 1 of the invention of the first embodiment. The light emitting tube 16 has a width of 10 mm to 40 mm in the direction perpendicular to the tube axis, and a length from several tens to about 800 mm, wherein these are determined in accordance with the size of the workpiece to be treated, the distance from the lamp to the workpiece to be treated, and the position of the lamp within the lamp unit (e.g., the width is 28 mm and the length is 560 mm). The insulating walls 171, 172 have a width in the direction perpendicular to the tube axis (the up/down direction in the cross section in FIG. 9(b)) of 24.5 to 25.5 mm and a length in the direction of the tube axis (the depth direction in FIG. 9(b)) of 400 to 470 mm, and a thickness (the left/right direction in FIG. 9(b)) of 0.5 to 1.2 mm. The insulating walls 171, 172 typically must be in proximity to the concave/convex surfaces of the first concave/convex surface 161 and the second concave/convex surface 162, separated by a gap that is in any case smaller than the outside diameter of the leads 412 to 452, preferably either touching the convexities of the first concave/convex surface 161 and the second concave/convex surface 162, or separated from the convexities of the first concave/convex surface 161 and the second concave/convex surface 162 by no more than 0.7 mm. The convexities of the first concave/convex surface 161 and the second concave/convex surface 162 face across a gap of 24 mm.

As stated above, using the filament lamp 1 of the invention of the fourth embodiment, basically the same results can be anticipated as with the filament lamp 1 of the invention of the first through third embodiments. Moreover, a cross section of the light emitting tube 16 in the direction perpendicular to the tube axis is that of a rectangular or square cornered tube, and so numerous leads can be placed within the light emitting tube more easily than in a light emitting tube that is a round tube with the same diameter as the cornered tube. Therefore, filament lamps that can realize highly precise control of temperatures on the workpiece to be treated can be manufactured more easily.

Figure 10:
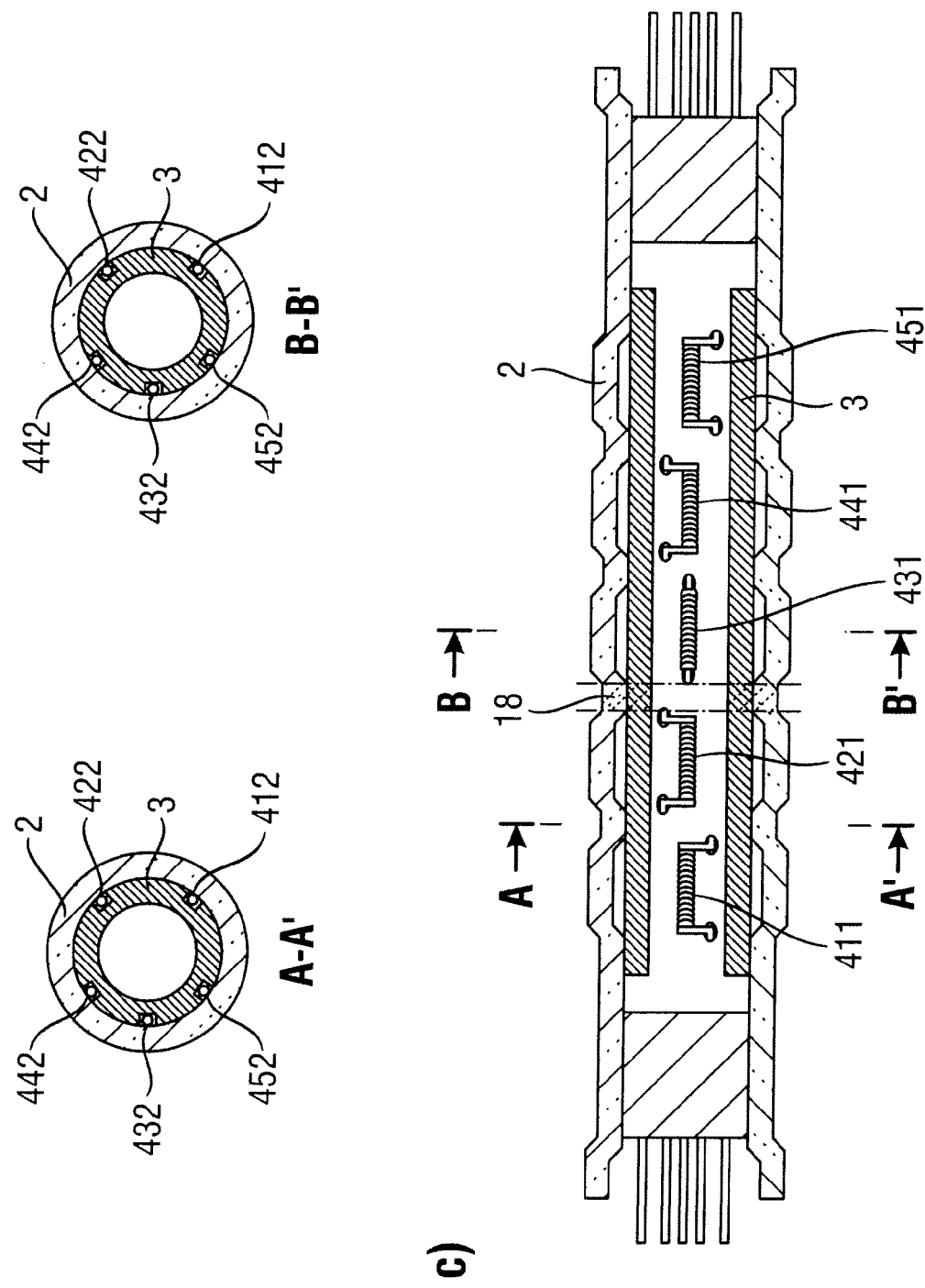
FIGS. 10(a)-10(c) are front cross-sectional views showing a filament lamp in accordance with another embodiment of the invention.

In the filament lamps of the inventions of the first through fourth embodiments, tubular insulating walls or plate-shaped insulating walls are placed in proximity to the inner surface of the light emitting tube and the heat of the tubular insulating walls or plate-shaped insulating walls can be transferred to the light emitting tube. By this means, the tubular insulating walls or plate-shaped insulating walls are kept from reaching high temperatures. By adopting the filament lamp 1 constitution shown in FIGS. 10-12 below, however, it is possible to transfer the heat of the tubular insulating walls or plate-shaped insulating walls to the light emitting tube more efficiently.

The fifth embodiment of this invention is explained using FIGS. 10(a)-10(c), which are front cross-sectional views showing the filament lamp 1 of the invention of the fifth embodiment, sectioned across and along the tube axis. FIG. 10(a) is a cross section of the filament lamp 1 taken in the radial direction at line A-A' of FIG. 10(c), FIG. 10(b) is a cross section of the filament lamp 1 taken in the radial direction at line B-B' of FIG. 10(c), and FIG. 10(c) is a cross section of the filament lamp 1 taken along the tube axis.

As shown in FIGS. 10(a)-10(c), the filament lamp 1 of the invention of this embodiment is one with an improvement added to the filament lamp 1 of the invention of the first embodiment, wherein the constitution is the same as that of the filament lamp 1 of the invention of the first embodiment except that the light emitting tube 2 and the inner tube 3 are fused together. This filament lamp 1 has an inner tube 3 located on the same axis as and in proximity to the inner surface of the light emitting tube 2, and the light emitting tube 2 and the inner tube 3 are partially fused in the circumferential direction by means of heating the outer surface of the light emitting tube 2, for example, with a burner. As shown in FIG. 10(a), the inner surface of the light emitting tube 2 and the outer surface of the inner tube 3 are in contact at the points where the light emitting tube 2 and the inner tube 3 are fused. As shown in FIG. 10(b), on the other hand, spaces are formed between the inner surface of the light emitting tube 2 and the outer surface of the inner tube 3 at the points where the light emitting tube 2 and the inner tube 3 are not fused.

By fusing the light emitting tube 2 and the inner tube 3 together in this way, the heat from the inner tube 3 can be efficiently transferred to the light emitting tube 2 from the fused region 18, so that it is possible to more reliably stop the inner tube 3 from reaching a high temperature. Moreover, because the inner tube 3 is fixed to the light emitting tube 2, rotation of the inner tube 3 in the circumferential direction can be regulated more reliably, so that the distribution of illuminance on the workpiece to be treated is not liable to deteriorate due to movement in the positions of the leads 412 to 452 of the filament assemblies 41 to 45, and the initial distribution of illuminance can be maintained for a long period of time. In filament lamps 1 in which the lead accommodation spaces 111 to 115 are formed by slots 311 to 315 in the inner tube 3 and the inside surface of the light emitting tube 2, especially, it is preferable that the light emitting tube 2 and the inner tube 3 be fused together. The area of the fused region 18 is determined in consideration of the power employed in the filaments 411 to 451.

As shown in FIGS. 10(a)-10(c), the light emitting tube 2 and the inner tube 3 are not fused except in the regions that correspond to spaces between the filaments 411 to 451 that are adjacent in the direction of the tube axis. For example, they are fused in the fused regions 18 where the light emitting tube 2 and the inner tube 3 are marked off by the circumscribed line drawn in a direction perpendicular to the tube axis from the outer edge of one filament (e.g., the filament 421) and the circumscribed line drawn in a direction perpendicular to the tube axis from the outer edge of another filament (e.g., the filament 431) that faces the end of the one filament (e.g., the filament 421), and are not fused in other regions. By means of such a construction, the light emitting tube 2 is constricted primarily in areas where between one of filaments 411 to 452 and the next, where light does not shine, and so it can be anticipated that unwanted condensing and diffusing of light by the curvature of the glass can be minimized.

In the filament lamp 1 using inner tube constituent members 121, 122 that are multiply divided in the circumferential direction as described with respect to FIG. 6 of the first embodiment or in the filament lamp 1 using a light emitting tube 13 having multiple slots 131 to 135 on its inner surface as described with respect to FIG. 7 of the second embodiment, the same effects as noted above can naturally be anticipated by fusing the light emitting tube 2 and the inner tube constituent members 121, 122 or the light emitting tube 13 and the inner tube 3.

The sixth embodiment of this invention is explained using FIGS. 11(a)-11(c), which are front cross-sectional views showing the filament lamp 1 of the invention of this embodiment, sectioned across and along the tube axis. FIGS. 11(a) & (b) are cross sections of the filament lamp 1 cut in the radial direction. FIG. 11(c) has a cross section of the filament lamp 1 cut along the direction of the tube axis at line A-A' in FIG. 11(a), a cross section of the filament lamp 1 cut along the direction of the tube axis at line B-B' in FIG. 11(b), and a front view of the filament lamp 1 as seen from C in FIG. 11(b).

As shown in FIGS. 11(a)-11(c), the filament lamp 1 of the invention of this embodiment is one with an improvement added to the filament lamp 1 of the invention of the third embodiment, wherein the constitution is the same as that of the filament lamp 1 of the invention of the third embodiment except that the light emitting tube 13 and the inner tube 15 are fused. In this filament lamp 1, an inner tube 15 is placed on the same axis as and in proximity to the inner surface of the light emitting tube 13, and the light emitting tube 13 and the inner tube 15 are partially fused in the direction of the tube axis by heating the outer surface of the light emitting tube 13 in the direction of the tube axis, for example, with a burner. At the points where the light emitting tube 13 and the inner tube 15 are fused, as shown in FIG. 11(a), the outer surface of the inner tube 15 is in contact with the inner surface of the light emitting tube 13. On the other hand, at the points where the light emitting tube 13 and the inner tube 15 are not fused, as shown in FIG. 11(b), a space is formed between the outer surface of the inner tube 15 and the inner surface of the light emitting tube 13.

Using the filament lamp 1 of the invention of this embodiment, the light emitting tube 13 and the inner tube 15 are fused, by which means it is possible to anticipate the following effects. First, it is possible to increase the fused area, and so it is possible to promote better heat transfer from the inner tube 15 to the light emitting tube 13, and the inner tube 15 can be more reliably kept from reaching a high temperature. Second, the inner tube 15 is hotter than the light emitting tube 13 when the filament lamp 1 is lit, and the amount of thermal expansion is greater in the inner tube 15 than in the light emitting tube 13, and so it is possible to reliably eliminate the likelihood of damage to the fused area due to shearing force working between the light emitting tube 13 and the inner tube 15. In the event that the light emitting tube 13 is longer in the direction of the tube axis because there are four or more filament assemblies 41 to 45, especially, it is preferable to fuse the light emitting tube 13 and the inner tube 15 in the direction of the tube axis.

The seventh embodiment of this invention is explained using FIGS. 12(a)-12(b), which are front cross-sectional views showing the filament lamp 1 of the invention of this embodiment, sectioned across and along the tube axis. FIG. 12(a) is a cross section of the filament lamp 1 cut in the radial direction. FIG. 12(b) has a cross section of the filament lamp 1 cut along the direction of the tube axis at line T-T' in FIG. 12(a).

As shown in FIGS. 12(a)-12(b), the filament lamp 1 of the invention of this embodiment is one with an improvement added to the filament lamp 1 of the invention of the fourth embodiment, wherein the constitution is the same as that of the filament lamp 1 of the invention of the fourth embodiment except that the light emitting tube 16 and the insulating walls 171, 172 are fused along their full length in the direction of the tube axis. In this filament lamp 1, a pair of insulating walls 171, 172 are placed along the inner walls on two sides of the light emitting tube 16, with the filaments 411 to 451 sandwiched therebetween, and the outer surface of the light emitting tube 16 is heated in the direction of the tube axis, for example, with a burner by which means the light emitting tube 16 and the insulating walls 171, 172 are fused in the direction of the tube axis.

Figure 13:
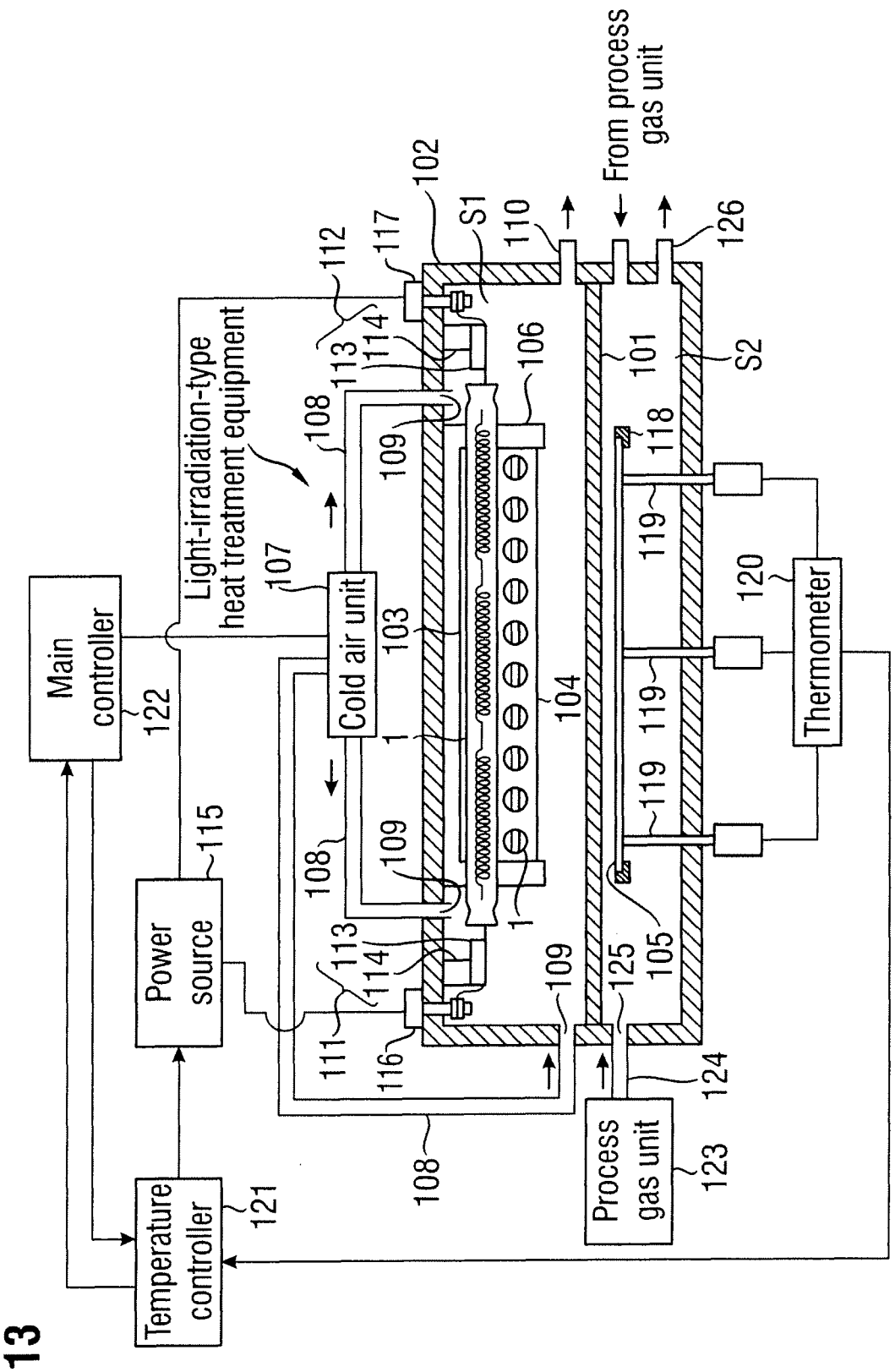
FIG. 13 is a front cross section showing a light-irradiation-type heat-treatment device in accordance with the invention.
Figure 14:
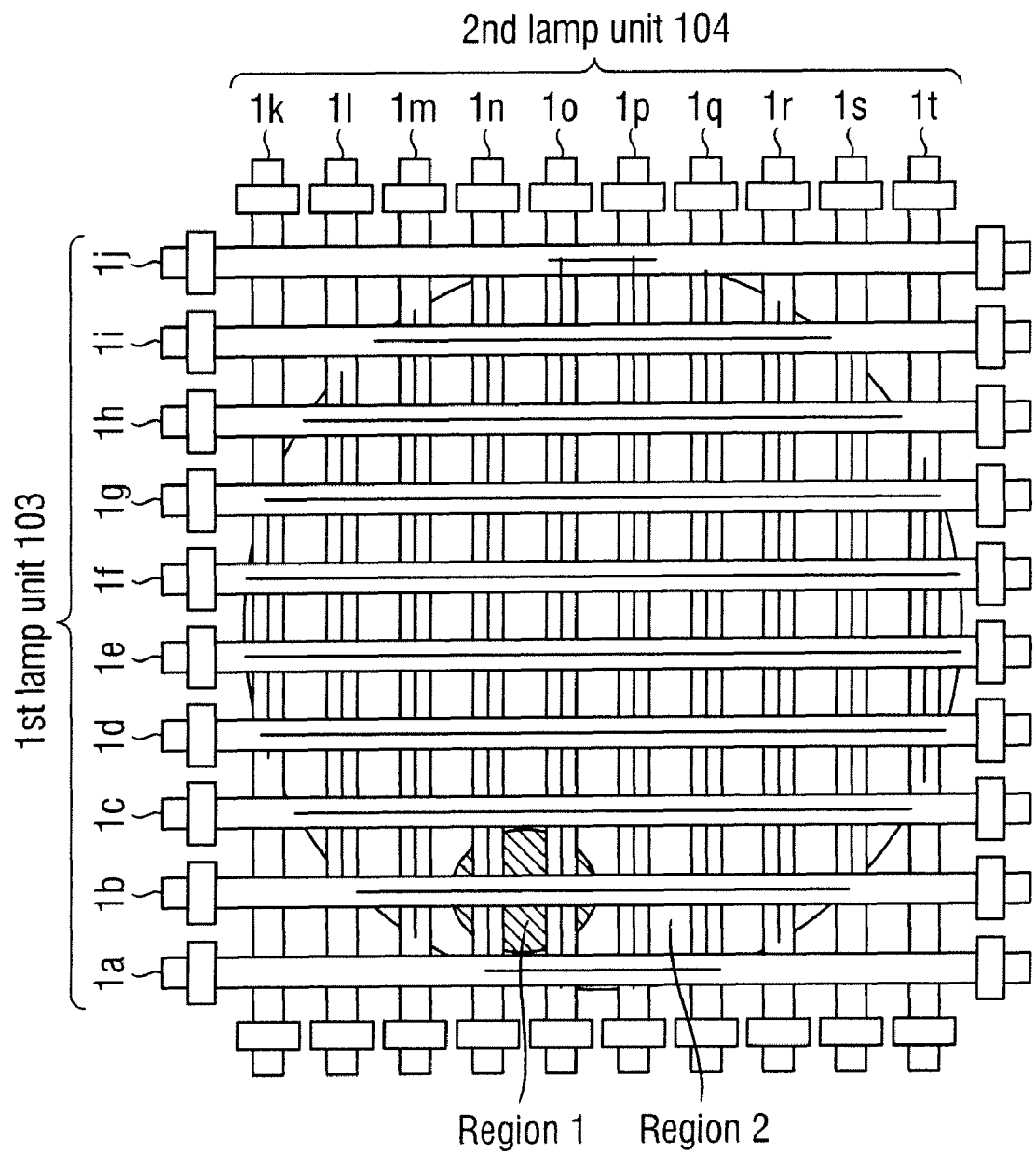
FIG. 14 is a plane view showing first and the second lamp units of FIG. 13 in accordance with the invention.
Figure 15:
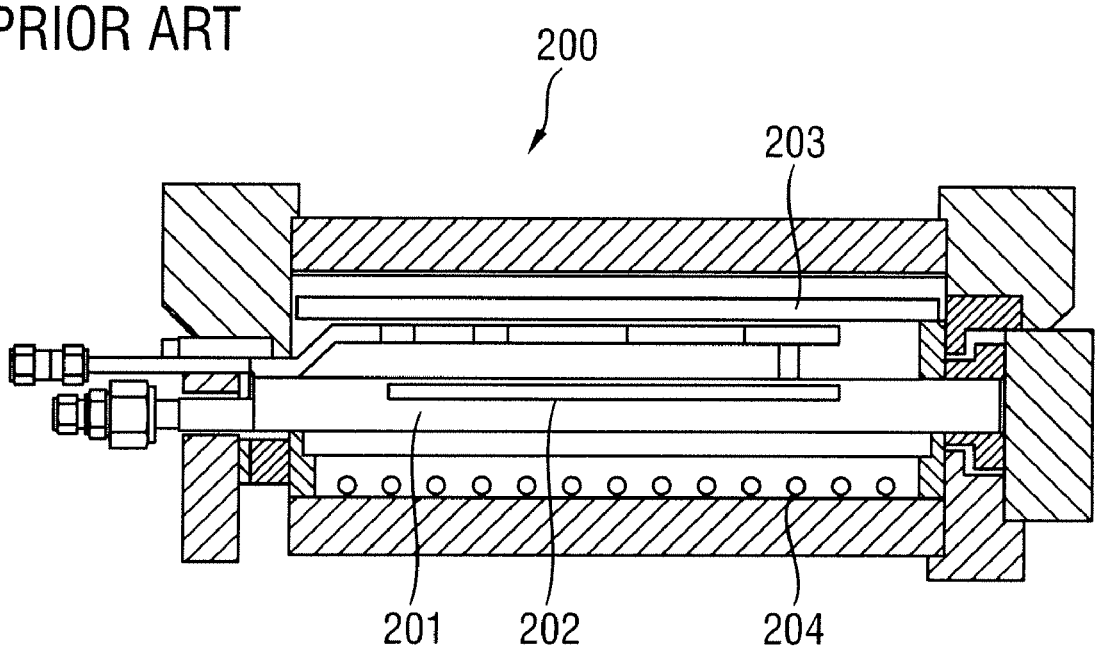
FIG. 15 is a cross section of a known heat treatment device.
Figure 16:
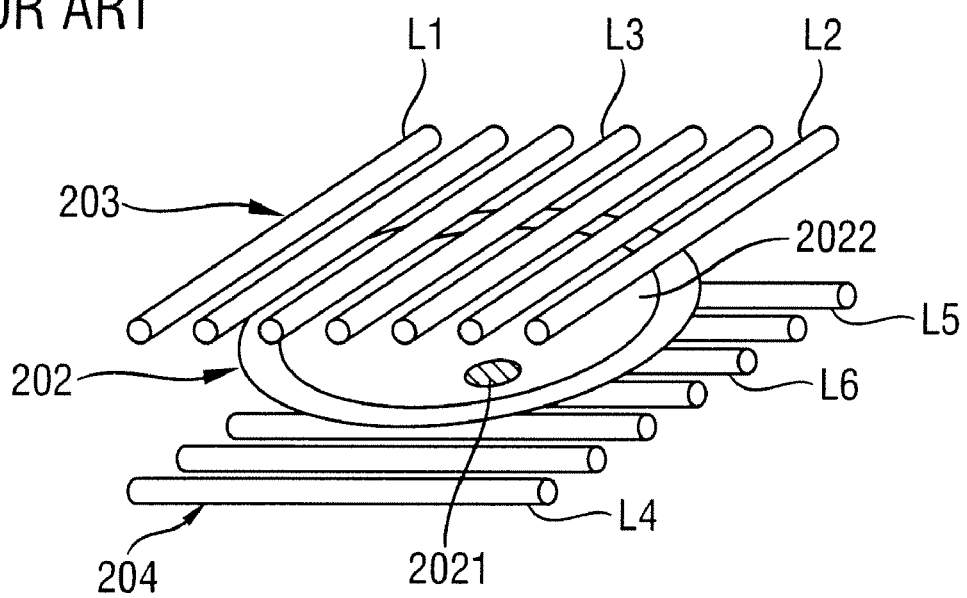
FIG. 16 is an simplified perspective view of the heat treatment device of FIG. 15.
Figure 17:
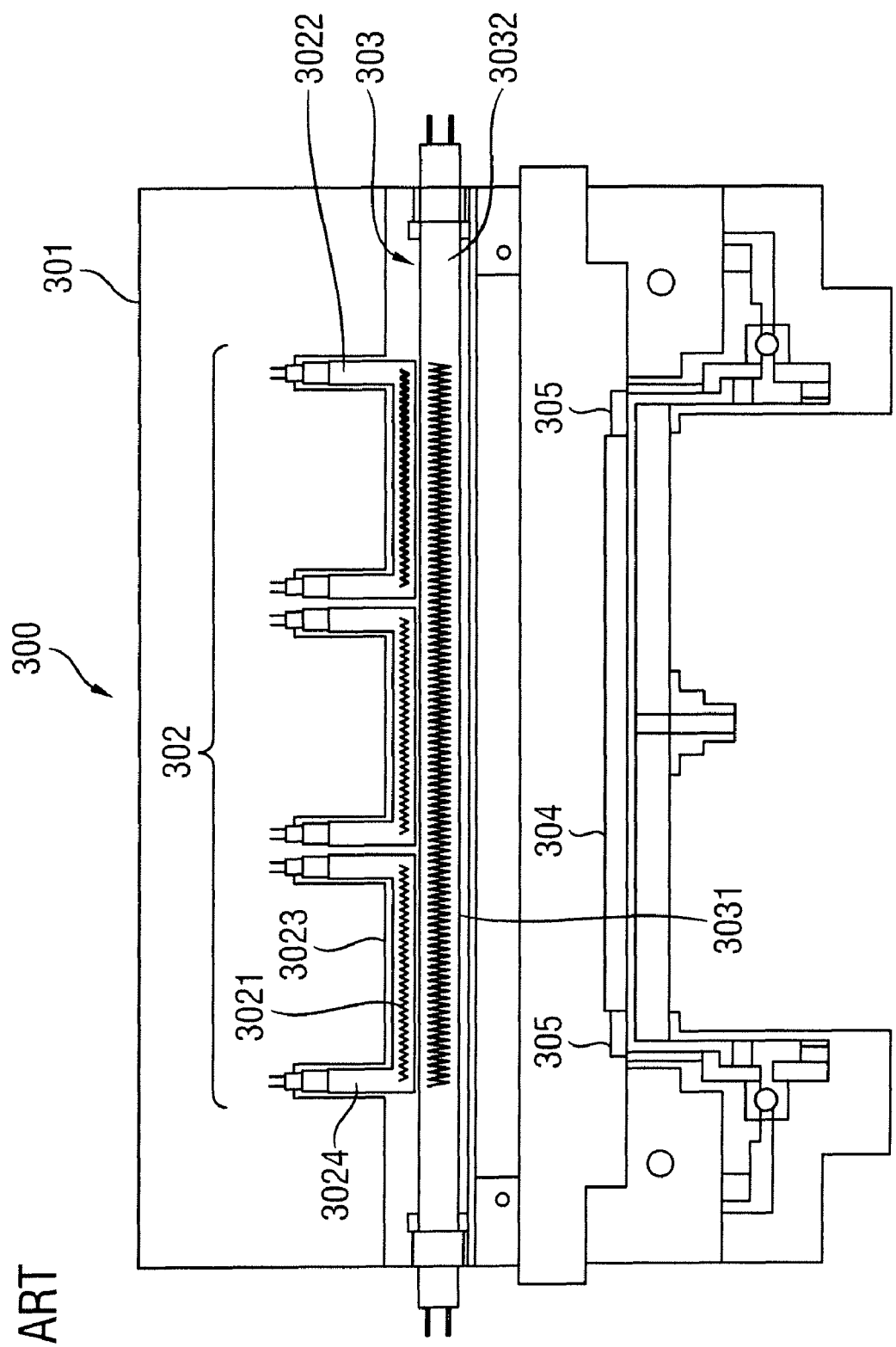
FIG. 17 is a cross section of another known heat treatment device.

The eighth embodiment of this invention is explained using FIGS. 13 & 14, wherein FIG. 13 is a front cross section showing the light-irradiation-type heat-treatment equipment of the invention of this embodiment, and FIG. 14 is a plan view showing the first lamp unit and the second lamp unit shown in FIG. 13. The light-irradiation-type heat-treatment equipment 100 is comprised with the filament lamps 1 of any of the inventions of the first through the seventh embodiment.

As shown in FIG. 13, this light-irradiation-type heat-treatment equipment 100 has a chamber 102 that is divided into a lamp unit accommodation space S1 and a heat-treatment space S2 by a quartz window 101. Heat treatment of a workpiece to be treated 105 is done by irradiating the workpiece to be treated 105, which is located in the heat-treatment space S2, with light that passes through the quartz window 101 after it is emitted by the first lamp unit 103 and the second lamp unit 104.

Figure 9:
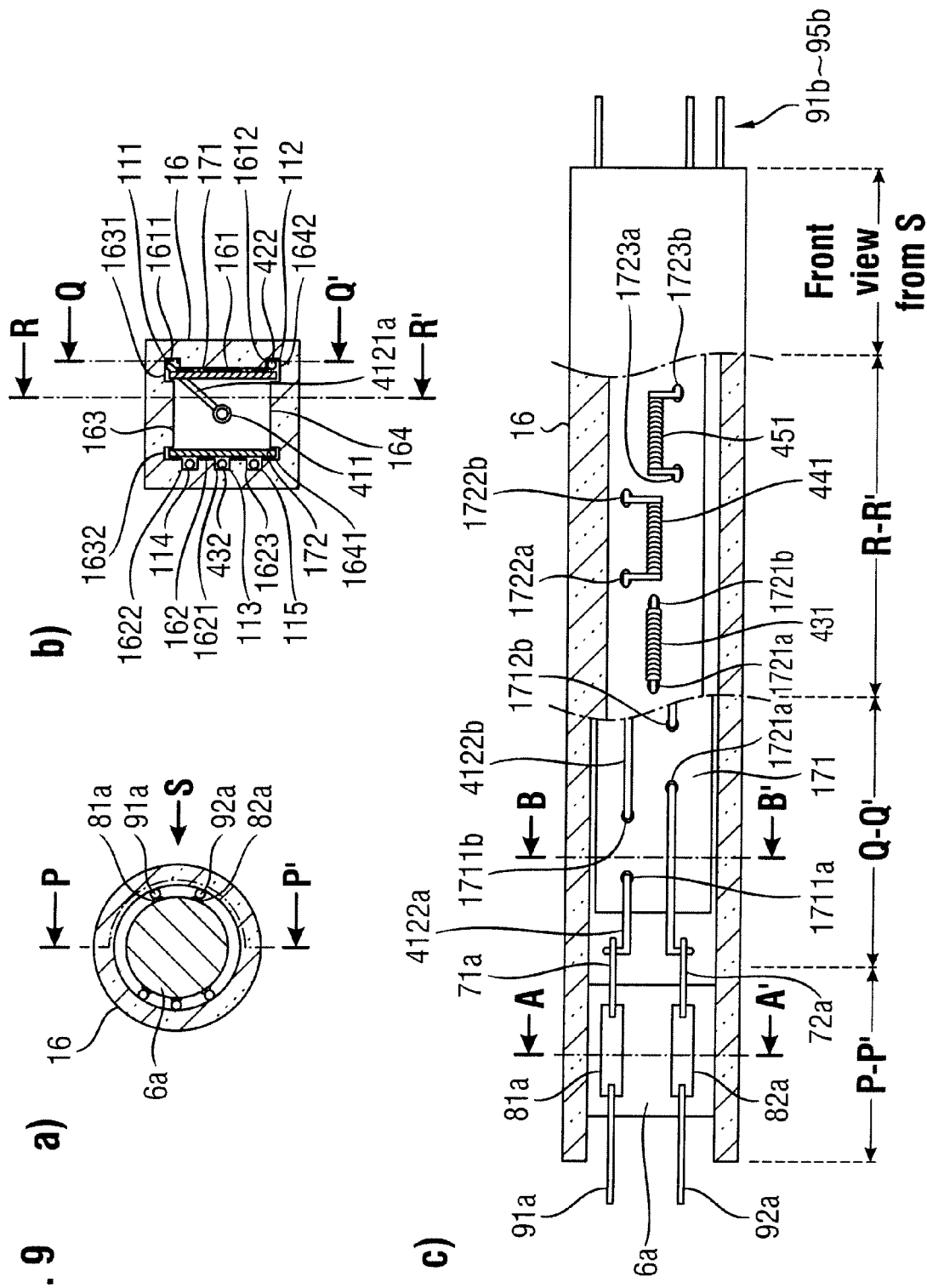
FIGS. 9(a)-9(c) are front cross-sectional views showing a filament lamp in accordance with another embodiment of the invention.

The first lamp unit 103 and the second lamp unit 104 accommodated in the lamp unit accommodation space S1 face each other, and each is constituted with, for example, ten filament lamps 1 arranged parallel to each other and separated by gaps of a specified size. As shown in FIG. 14, the direction of the tube axes of the filament lamps 1 that make up the first lamp unit 103 intersects the direction of the tube axes of the filament lamps 1 that make up the second lamp unit 104. Although two stages of lamp units, as shown in FIG. 9, can be employed, a constitution with only one lamp unit stage is also acceptable.

Reflecting optics 106 are located above the first lamp unit 103. The reflecting optics 106, for example, can have a structure of a gold coating on a base material of oxygen-free copper, and the cross section of the reflecting surface has a shape such as a partial circle, a partial ellipse, a partial parabola, or a flat plate. Light that is emitted upward by the first lamp unit 103 and the second lamp unit 104 is reflected toward the workpiece to be treated 105 by the reflecting optics 106. In other words, the light emitted by the first lamp unit 103 and the second lamp unit 104 is reflected by the reflecting optics 106 and irradiates the workpiece to be treated 105.

Cold air from the cold air unit 107 is introduced into the lamp unit accommodation space S1 through the jets 109 of the cold air supply nozzles 108 installed in the chamber 102. The cold air introduced into the lamp unit accommodation space S1 is blown onto the filament lamps 1 of the first lamp unit 103 and the second lamp unit 104, thereby cooling the light emitting tubes that make up the filament lamps 1. The seal areas of the filament lamps 1 have a lower resistance to heat than other parts. It is desirable, therefore, that the jets 109 of the cold air supply nozzles be directed toward the seal areas of the filament lamps 1, and that they be constituted to give priority to cooling the seal areas of the filament lamps 1.

The cold air that is blown on the filament lamps 1 and reaches a high temperature by means of heat exchange is exhausted by way of the cold air exhaust port installed in the chamber 102. Consideration has been given so that the flow of cold air does not, conversely, heat the filament lamps 1 after it has reached a high temperature by means of heat exchange. The flow of this cold air is set so that it cools the reflecting optics 106 at the same time. It is not necessary to set the flow of air to cool the reflecting optics 106 at the same time, for example, in the event that the reflecting optics are water-cooled by a water cooling mechanism (not shown).

Incidentally, there may be an accumulation of heat in the quartz window 101, due to radiant heat from the heated workpiece 105. Secondary thermal radiation from the quartz window 101 that has accumulated heat sometimes has an undesirable effect of heating the workpiece to be treated 105. In this case, there may be such problems as redundancy of temperature control of the workpiece to be treated 105 (e.g., overshoot such that the temperature of the workpiece to be treated 105 is hotter than the set temperature) or reduced temperature uniformity in the workpiece to be treated 105 due to the temperature of the quartz window 101 that has accumulated heat. Moreover, it becomes difficult to increase the rate of cooling of the workpiece to be treated 105. To suppress these problems, therefore, it is desirable to install a jet 109 of a cold air supply nozzle 108 in the vicinity of the quartz window 101, as shown in FIG. 13, and to cool the quartz window 101 with cold air from the cold air unit 107.

Each filament lamp 1 of the first lamp unit 103 is supported by a pair of first fixed stages 111, 112. The first fixed stages 111, 112 comprise conductive stages 113 that are formed of conductive material and holding stages 114 that are formed of an insulating material such as a ceramic. The holding stages 114 are mounted on the inner wall of the chamber 102 and hold the conductive stages 113. Taking the number of filament lamps 1 in the first lamp unit 103 as n1 and the number of filament assemblies per filament lamp 1 as m1, the number of paired sets of first fixed stages 111, 112 is n1×m1 sets, in the event that power is supplied independently to all of the filament assemblies. Each filament lamp 1 of the second lamp unit 104, on the other hand, is supported by second fixed stages. Like the first fixed stages 111, 112, the second fixed stages comprise conductive stages and holding stages. Taking the number of filament lamps 1 in the second lamp unit 104 as n2 and the number of filament assemblies per filament lamp 1 as m2, the number of paired sets of second fixed stages is n2×m2 sets, in the event that power is supplied independently to all of the filament assemblies.

Pairs of electrical power-supply ports 116, 117 are installed in the chamber 102 and connected to power feed wires from the power supply of the power source 115. A single pair of power-supply ports 116, 117 is shown in FIG. 13, but the number of power-supply ports is determined by the number of filament lamps 1 and the number of filament assemblies in each filament lamp 1. In FIG. 13, the power-supply ports 116, 117 are electrically connected to the conductive stages 113 of the first lamp fixed stages 111, 112. The conductive stages 113 of the first lamp fixed stages 111, 112, for example, are electrically connected to the external leads. By means of such a constitution, it becomes possible to feed power from the power supply in the power source 115 to a filament assembly of one filament lamp in the first lamp unit 103. The other filament assemblies of that filament lamp 1, the filaments of the other filament lamps 1 in the first lamp unit 103, and the filaments of each filament lamp 1 in the second lamp unit 104 are similarly connected electrically to other paired power-supply ports.

Moreover, a treatment stage 118 to which the workpiece to be treated 105 is fixed is installed in the heat-treatment space S2. If the workpiece to be treated 105, for example, is a semiconductor wafer, the treatment stage 118 is a thin, ring-shaped plate of a high-melting-point metal such as molybdenum, tungsten, or tantalum or a ceramic, such as silicon carbide (SiC), or quartz or silicon (Si). Preferably it has a guard-ring structure formed with steps to hold the semiconductor wafer within a round opening. The semiconductor wafer that is the workpiece to be treated 105 is placed so that the semiconductor wafer is held in the round opening of the round guard ring and supported by the steps. The treatment stage 118 is itself heated by light irradiation and provides supplementary heat to the outer edge of the semiconductor wafer that faces it. Advantageously, this compensates for the heat radiated from the outer edge of the semiconductor wafer. By this means, temperature drops at the periphery of the semiconductor wafer due to heat radiated from the outer edge of the semiconductor wafer can be suppressed.

On the reverse side from the light-irradiation side of the workpiece to be treated 105 that is set in the treatment stage 118, there are temperature measurement areas 119 in contact with or close to the workpiece to be treated 105. The temperature measurement areas 119 monitor the temperature distribution of the workpiece to be treated 105, wherein their number and placement depends on the dimensions of the workpiece to be treated 105. For example, thermocouples or radiant heat thermometers can be used as the temperature measurement areas 119. The temperature information monitored by the temperature measurement areas 119 is transmitted to the thermometer 120. On the basis of the temperature information transmitted by the temperature measurement areas 119, the thermometer 120 calculates the temperatures at the points measured by each temperature measurement area 119 and sends the calculated temperature information to the main controller 122 by way of the temperature controller 121. Based on the temperature information for the points measured on the workpiece to be treated 105, the main controller 122 sends the temperature controller 121 commands to make designated temperatures on the workpiece to be uniformly treated 105. On the basis of these commands, the temperature controller 121 controls the power supplied from the power source 115 to each filament assembly of the filament lamps 1. For example, if the main controller 121 receives temperature information from the temperature controller 121 to the effect that the temperature of a certain measured point is lower than the specified temperature, it sends the temperature controller 121 a command to increase the amount of power fed to the filament assembly next to the measured point, so that the light emitted from the light emitting area of that filament assembly will increase. Based on the command transmitted from the main controller 122, the temperature controller 121 will increase the power supplied from the power source 115 to the power-supply ports 116, 117 connected to that filament assembly.

While the filament lamps 1 in the first and second lamp units 102, 103 are lit, the main controller 122 sends commands to the cold air unit 107 so that the light emitting tubes and the quartz window 101 will not reach a high temperature. Depending on the type of heat treatment, moreover, a process gas unit 123 that introduces and exhausts process gases can be connected to the heat-treatment space S2. For example, if a hot oxidation process is to be conducted, a process gas unit 123 is connected to the heat-treatment space S2 to introduce and exhaust oxygen gas and a purge gas (e.g., such as nitrogen gas) to purge the heat-treatment space S2. The process gases and purge gases from the process gas unit 123 are introduced into the heat-treatment space S2 from the jet 125 of the gas supply nozzle 124 installed in the chamber 102 and they are exhausted through the exhaust port 126.

Using the light-irradiation-type heat-treatment equipment 100 described above, it is possible to achieve the following effects. Within the filament lamps 1 mounted in the lamp units 103, 104 that are the light source of the light-irradiation-type heat-treatment equipment 100, the light emitting areas comprise the filament assemblies and insulating walls shown in the first through the seventh embodiments above, and the power supplied to each filament can be controlled independently, so that setting the light-intensity distribution can be regulated even in the tube axis direction of the light emitting tubes. Therefore, the treatment intensity distribution on the surface of the workpiece to be treated 105 can also be set with high precision in two dimensions. For example, for a small special region (such as special region 1 in FIG. 14) that is shorter than the light emission length of the filament lamps used in the light source of the light-irradiation-type heat-treatment equipment of the related art, it is possible to set the irradiation intensity for a special region (e.g., region 1) and limit it to that special region (e.g., region 1). That is, it is possible to set the distribution of illuminance to suit the respective characteristics of both the special region (e.g., region 1) and the other region (e.g., region 2 in FIG. 10). Therefore, it is possible to control the temperatures of the special region and the other region (e.g., region 2) so that they are uniform. Similarly, it is possible to suppress the occurrence of localized temperature distributions on the workpiece to be treated 105, and to obtain a uniform temperature distribution across the full workpiece to be treated 105.

Moreover, because filament lamps 1 which have very fine and closely spaced filament leads in the light emitting tubes are used in the light-irradiation-type heat-treatment equipment of this invention, the influence of the gaps between filaments, which do not emit light, can be reduced. Further, the space holding the lamp units 103, 104 that comprise multiple tubular filament lamps 1 can be kept small in height for the light-irradiation-type heat-treatment equipment 100, and so the size of the light-irradiation-type heat-treatment equipment 100 can be reduced.

By means of the filament lamps 1 that are mounted in this light-irradiation-type heat-treatment device 100, as was explained in connection with the inventions of the first embodiment through the seventh embodiment, the insulating wall located inside each filaments supports the leads of that filament so that it does not short circuit with the leads of other filaments. Even in a constitution with multiple filament assemblies within a light emitting tube, therefore, leads are not located outside the filaments, and so it is easy to obtain the desired light-distribution of illuminance with the light emitted by the filaments and not blocked by the leads, while assuring insulation between the leads.

Although the light-irradiation-type heat-treatment equipment of this invention has been described in terms of lamp units 103, 104 constituted with multiple, parallel filament lamps 1 employed as the light source, in further embodiments a light source constituted with a single filament lamp 1 can be employed, as will be appreciated by those skilled in the relevant art(s).

Although the workpieces to receive heat treatment in the light-irradiation-type heat-treatment equipment of this invention are described in terms of semiconductor wafers, in further embodiments the equipment can be applied to crystalline silicon substrates or glass or ceramic substrates for solar cell panels, or glass substrates for liquid-crystal displays, etc., as will be appreciated by those skilled in the relevant art(s).

For example, rectangular substrates of various materials are often used for solar cell panels, and most of the light-irradiation-type heat-treatment devices used for heat treatment of such workpieces is constituted to move the rectangular substrate horizontally and to provide heat treatment by irradiation with a band of light, either by means of a single filament lamp that is placed so that the tube axis extends in a direction perpendicular to the direction of substrate movement, or by means of multiple filament lamps arrayed to provide heat treatment by irradiating with a band of light. Using a filament lamp 1 having four or more filament assemblies in such cases makes it possible, while compensating for the temperature drop in the two areas parallel to the direction of substrate motion (e.g., at the two ends of the band), to regulate the distribution of illuminance on the center of the substrate (e.g., at the center of the band), and thus to assure more precise temperature control.

What is claimed is:
1. A filament lamp, comprising:
a light emitting tube which is formed with a hermetic seal area on at least one end;
multiple filament assemblies, each filament assembly comprising a coiled filament and connected leads to supply power to that filament, within said light emitting tube, the filaments being sequentially arranged in the axial direction of the light emitting tube, the leads of each filament assembly being electrically connected to respective multiple conductive pieces located in the seal area, and power being independently suppliable to each of the filaments;

an insulating wall provided within the light emitting tube between the filaments and leads, the insulating wall having openings, located along the tube axis in proximity to the inner wall of the light emitting tube, and multiple lead accommodation spaces, corresponding to the number of leads, formed to extend along the tube axis of the light emitting tube and divided by the light emitting tube and the insulating walls, wherein each lead connected to a filament passes through one of the openings in the insulating wall and is placed without short circuits in one of the lead accommodation spaces.

2. The filament lamp of claim 1, wherein the insulating wall comprises an inner tube fitted on the same axis as the light emitting tube.

3. The filament lamp of claim 2, wherein multiple slots are formed on the outer surface of the inner tube, corresponding to the number of leads connected to their respective filaments, extending along the tube axis of the light emitting tube and separated from each other in the circumferential direction, and wherein the lead accommodation spaces are formed by the slots and the inner surface of the light emitting tube.

4. The filament lamp of claim 2, wherein multiple slots are formed on the inner surface of the light emitting tube, corresponding to the number of leads connected to their respective filaments, extending along the tube axis of the light emitting tube and separated from each other in the circumferential direction, and wherein the lead accommodation spaces are formed by the slots and the outer surface of the inner tube.

5. The filament lamp of claim 2, wherein openings are formed in the inner tube such that light emitted by the filaments is emitted without being obstructed.

6. The filament lamp of claim 1, wherein multiple slots are formed on the inner surface of the light emitting tube, corresponding to the number of leads connected to their respective filaments, extending along the tube axis of the light emitting tube and separated from each other in the circumferential direction, wherein the insulating wall comprises pairs of facing plates with the filaments sandwiched therebetween them, and wherein the lead accommodation spaces are formed by the slots and the plates.

7. The filament lamp of claim 1, wherein the insulating wall is fused.

8. The filament lamp of claim 1, wherein the light emitting tube and the insulating wall are fused along the tube axis of the light emitting tube.

9. The filament lamp of claim 1, wherein the lead accommodation spaces are formed so that all leads of filaments other than a given filament are positioned in a region other than the region that includes at least that filament, which is enclosed, in a cross section perpendicular to the tube axis of the light emitting tube, by the tube wall of the light emitting tube and two circumscribed lines perpendicular to the filament.

10. The filament lamp of claim 1, wherein the seal area is formed by putting a rod-shaped sealing insulator in place, and with multiple conductive pieces arrayed at intervals around the periphery of the sealing insulator, hermetically sealing the light emitting tube and the sealing insulator with the conductive pieces between them.

11. A light irradiation heat treatment device fitted with a light source in which is located a filament lamp, a workpiece to be treated being heated by irradiation of the workpiece to be treated with light from that light source, wherein the filament lamp, comprises:

a light emitting tube which is formed with a hermetic seal area on at least one end, multiple filament assemblies, each filament assembly comprising a coiled filament connected at both ends to leads that supply electrical power to the filament, the filaments being in a linear arrangement within the light emitting tube and extending along the tube axis of the light emitting tube, power supply means for independently supplying power to each filament by means of electrical connection of the leads of the filament assemblies to multiple conductive pieces located in the seal area, an insulating wall provided within the light emitting tube between the filaments and leads, the insulating wall having openings, located along the tube axis in proximity to the inner wall of the light emitting tube, and multiple lead accommodation spaces, corresponding to the number of leads, formed to extend along the tube axis of the light emitting tube and divided by the light emitting tube and the insulating walls, wherein each lead connected to a filament passes through one of the openings in the insulating wall and is placed without short circuits in one of the lead accommodation spaces.

12. A light irradiation heat treatment device fitted with a lamp unit in which are arrayed multiple filament lamps, a workpiece to be treated being heated by irradiation of the workpiece to be treated with light from that lamp unit, wherein each of the filament lamps comprises:

a light emitting tube which is formed with a hermetic seal area on at least one end, multiple filament assemblies, each filament assembly comprising a coiled filament connected at both ends to leads that supply electrical power to the filament, the filaments being in a linear arrangement within the light emitting tube and extending along the tube axis of the light emitting tube, power supply means for independently supplying power to each filament by means of electrical connection of the leads of the filament assemblies to multiple conductive pieces located in the seal area, an insulating wall provided within the light emitting tube between the filaments and leads, the insulating wall having openings, located along the tube axis in proximity to the inner wall of the light emitting tube, and multiple lead accommodation spaces, corresponding to the number of leads, formed to extend along the tube axis of the light emitting tube and divided by the light emitting tube and the insulating walls, wherein each lead connected to a filament passes through one of the openings in the insulating wall and is placed without short circuits in one of the lead accommodation spaces.

* * * * *